(12) United States Patent
Azar et al.

(10) Patent No.: US 7,567,435 B2
(45) Date of Patent: Jul. 28, 2009

(54) HEAT SINK ASSEMBLY

(75) Inventors: Kaveh Azar, Westwood, MA (US);
Joseph P. Mennucci, Manville, RI (US);
Carlo Mandrone, Newburyport, MA (US)

(73) Assignee: Advanced Thermal Solutions, Inc., Norwood, MA (US)

( * ) Notice: Subject to any disclaimer, the term of this patent is extended or adjusted under 35 U.S.C. 154(b) by 108 days.

(21) Appl. No.: 11/073,831

(22) Filed: Mar. 7, 2005

(65) Prior Publication Data

US 2006/0198107 A1 Sep. 7, 2006

(51) Int. Cl.
*H05K 5/00* (2006.01)
*H05K 7/00* (2006.01)
*H05K 7/20* (2006.01)

(52) U.S. Cl. .................. 361/679.54; 361/703; 361/709

(58) Field of Classification Search ................ 361/679, 361/688, 689, 690, 702, 703, 704, 679.54, 361/709; 257/706, 718, 719, 720
See application file for complete search history.

(56) References Cited

U.S. PATENT DOCUMENTS

| | | | | |
|---|---|---|---|---|
| 5,313,099 A | | 5/1994 | Tata et al. ................... 257/717 |
| 5,428,897 A | * | 7/1995 | Jordan et al. ............. 29/890.03 |
| 5,464,054 A | * | 11/1995 | Hinshaw et al. ............ 165/80.3 |
| 5,668,348 A | * | 9/1997 | Lin ........................... 174/16.3 |
| 5,676,199 A | * | 10/1997 | Lee ............................ 165/80.3 |
| 5,766,978 A | * | 6/1998 | Johnson ....................... 438/15 |
| 6,029,330 A | * | 2/2000 | Ratia, Jr. ...................... 29/235 |
| 6,442,045 B1 | * | 8/2002 | Goodwin et al. ............ 361/816 |
| 6,466,443 B1 | * | 10/2002 | Chen .......................... 361/695 |
| 6,519,153 B1 | * | 2/2003 | Shia et al. ................... 361/704 |
| 2003/0048610 A1 | * | 3/2003 | Herring et al. .............. 361/704 |
| 2003/0133248 A1 | * | 7/2003 | Chiang ....................... 361/213 |
| 2004/0001315 A1 | * | 1/2004 | Li ............................... 361/697 |
| 2004/0156171 A1 | * | 8/2004 | Dong et al. .................. 361/704 |
| 2004/0190262 A1 | * | 9/2004 | Lai et al. ..................... 361/704 |
| 2005/0243525 A1 | * | 11/2005 | Llapitan et al. ............. 361/719 |

\* cited by examiner

*Primary Examiner*—Jayprakash N Gandhi
*Assistant Examiner*—Anthony M Haughton
(74) *Attorney, Agent, or Firm*—Lieberman & Brandsdorfer, LLC

(57) ABSTRACT

A heat sink assembly mount is provided. Generally the invention has a frame clip and a spring clip. The frame clip has one or more inwardly extending tabs and two or more vertically extending side portions. The one or more tabs are sized to fit over and removably couple to a heat producing device. The distance between the two or more vertically extending side portions is sized to hold a base portion of a heat sink and prevent horizontal motion of the heat sink. The spring clip couples to the frame clip and has a spring bias sized to produce a vertical force that presses the heat sink against a heat producing device.

21 Claims, 34 Drawing Sheets

214    216

US 7,567,435 B2

HEAT SINK ASSEMBLY

FIELD OF THE INVENTION

The present invention is generally related to heat sinks, and more particularly is related to an assembly for a heat sink.

BACKGROUND OF THE INVENTION

Effective extraction of heat produced by electrical devices is important in order to extend the useful life of these devices. A conventional heat sink device typically utilizes an array of extended surfaces, such as fins, integrally formed on a common base and projecting into ambient fluid surrounding the device. The base is placed in thermally intimate contact with a heat producing device to provide a conduction path to the fin array. Fluid circulation, through forced or natural convection, around the fin array, acts as a heat transfer medium to cool the heat producing device to a satisfactory operating temperature.

It is well recognized that various design parameters including fin geometry (e.g., the number of fins, fin spacing, and fin length and width), material selection, device characteristics, and ambient conditions, among others, influence the heat dissipation performance of the heat sink device (hereafter, heat sink). In certain applications, a plurality of fins arranged with predetermined dimensions, or predetermined channel width between adjacent fins may provide optimum heat sink performance.

FIG. 1 is an exploded perspective view of a prior art heat sink assembly 100. A base clip 102 removably couples a heat sink 104 to a microchip 106. The base of the heat sink 104 is placed in contact with the microchip 106. A thermally conductive layer 108 can be placed in between the heat sink 104 and the microchip 106 to aid in the conduction of heat. The base clip 102 is then placed over the top of the heat sink 104. The base clip 102 couples to the bottom of the microchip 106 with two inward tabs 110 that frictionally fit to a bottom edge 112 of the microchip 106.

The heat sink 104 can be replaced or removed by uncoupling the base clip 102 from the microchip 106 and removing the base clip 102. Once the base clip 102 is removed, the heat sink 104 can be removed and/or replaced. The base clip 102 is then placed over the heat sink 104 and coupled to the microchip 106. The uncoupling and coupling of the base clip 102 to the microchip 106 can produce stress on the microchip 106 and result in damage to the microchip 106.

Thus, a heretofore unaddressed need exists in the industry to address the aforementioned deficiencies and inadequacies.

SUMMARY OF THE INVENTION

Embodiments of the present invention provide a heat sink assembly mount and method of mounting a heat sink. Briefly described, in architecture, one embodiment of the heat sink assembly mount, among others, can be implemented as follows. In one exemplary embodiment, the heat sink assembly mount has a frame clip and a spring clip. The frame clip has one or more inwardly extending tabs and two or more vertically extending side portions. The one or more tabs can be sized to fit over and removably couple to a heat producing device. A distance between the two or more vertically extending side portions can be sized to hold a base of a heat sink, which prevents horizontal motion of the heat sink. The spring clip is coupled to the frame clip. The spring clip has a spring bias sized to produce a vertical force pressing the heat sink against the heat producing device.

In another exemplary embodiment, the heat sink assembly includes a heat sink, a frame clip, and a spring clip. The heat sink has a base portion and a top fin portion. The frame clip has a top wall portion and a bottom wall portion. The top wall portion has a perimeter sized to receive the base portion of the heat sink and prevent horizontal motion of the heat sink. The bottom wall portion of the frame clip has a perimeter sized to receive a chip. The bottom wall portion also has an inwardly extending ridge with an inner ridge perimeter sized to fit over and removably couple to a heat producing device. The spring clip is removably coupled to the frame clip and rests against the heat sink. The spring clip has a spring bias sized to produce a vertical force pressing the heat sink against the heat producing device.

The present invention can also be viewed as providing methods for installing a heat sink on a heat producing device. In this regard, one embodiment of such a method, among others, can be broadly summarized by the following steps: coupling the frame clip to the heat producing device; placing the base of the heat sink within the frame clip; placing the spring clip over the heat sink; and coupling the spring clip to the frame clip.

Other systems, methods, and advantages of the present invention will be or become apparent to one with skill in the art upon examination of the following drawings and detailed description. It is intended that all such additional systems, methods, features, and advantages be included within this description, be within the scope of the present invention, and be protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Figure 1:
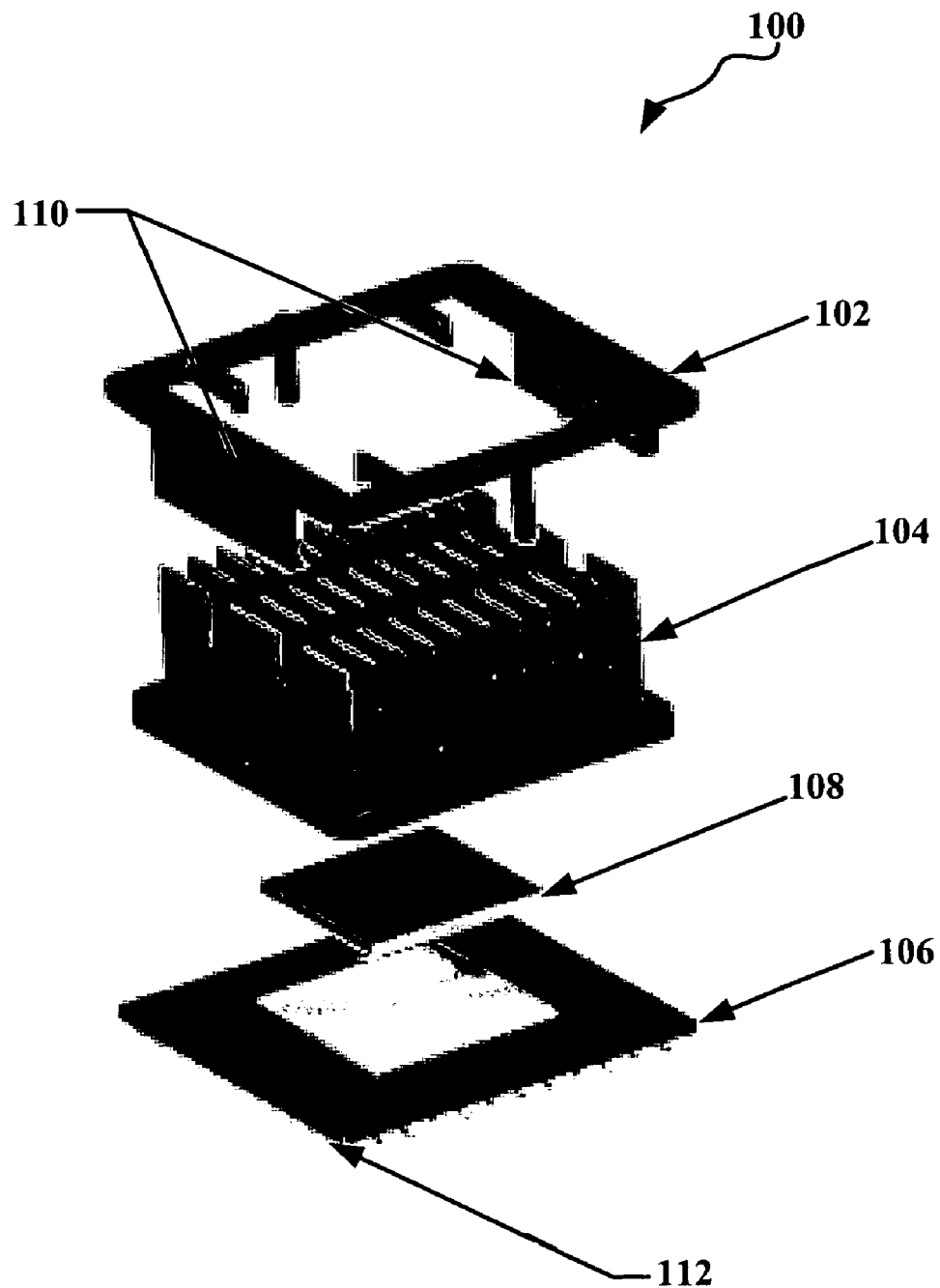
FIG. 1 is an exploded perspective view of a prior art heat sink assembly.
Figure 2:
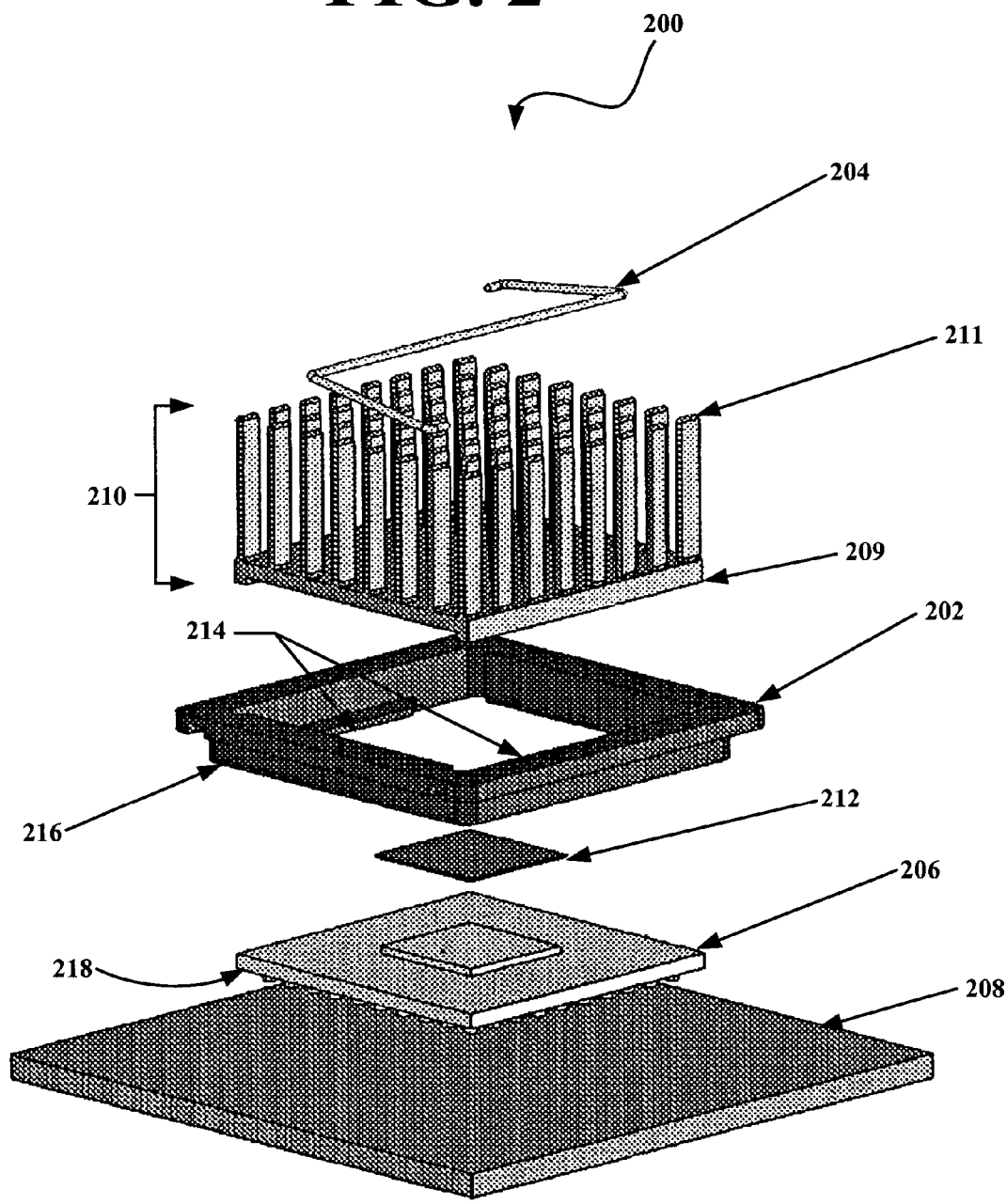
FIG. 2 is an exploded perspective view of a heat sink assembly in accordance with a first exemplary embodiment.
Figure 3:
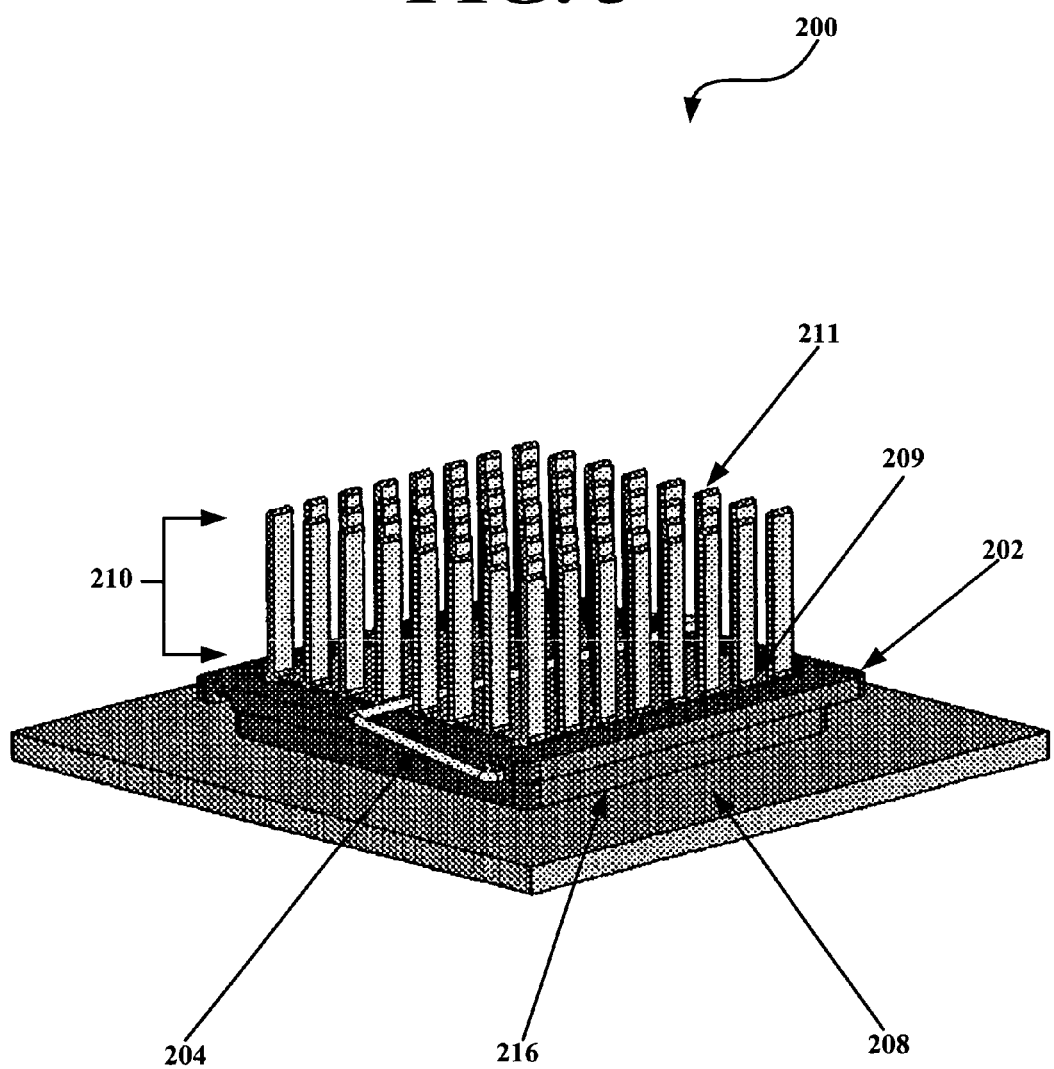
FIG. 3 is an assembled perspective view of the heat sink assembly in accordance with the first exemplary embodiment.

FIG. 2 and FIG. 3 are, respectively, an exploded and assembled perspective view of a heat sink assembly 200 in accordance with a first exemplary embodiment of the invention. The heat sink assembly 200 has a frame clip 202 and a spring clip 204. A heat producing device 206 can be coupled to a board 208, such as a printed circuit board, or other support structure. The board 208 can be, for example, but not limited to, a motherboard or other component that can be coupled to the heat producing device 206. The heat producing device 206 can be a variety of devices, for example, an integrated circuit or a variety of other optical or electrical components. A heat sink 210 is used to dissipate heat from the heat producing device 206. The heat sink 210 has a base 209 portion and a top fin 211 portion. Individual fins 211 may vary in length and individual fins 211 may be at varying angles with respect to the base 209. The heat sink 210 can be positioned against the heat producing device 206. The heat is transferred from the heat producing device 206 to the heat sink 210 by conduction. A thermally conductive layer 212 can be placed in between the heat sink 210 and the heat producing device 206 to aid in the conduction of heat.

The frame clip 202 fits over the heat producing device 206. Tabs 214 extend from a base 216 of the frame clip 202 and couple to a bottom edge 218 of the heat producing device 206. The heat sink 210 fits within the frame clip 202. The spring clip 204 removably couples to the frame clip 202. The base 216 of the frame clip 202 can rest against the board 208. The frame clip 202 can be used to transfer the weight, or any forces distributed to the heat sink 210, directly to the board 208 instead of passing through the heat producing device 206. For example, an accidental jarring of the heat sink 210 can be transferred to the board 208 and prevent unwanted application of forces to the heat producing device 206 and potentially damaging the heat producing device 206. It should be noted that the spring clip 204 does not touch the board 208 and the spring clip 204 is directly attached to the frame clip 202. Alternatively, one having ordinary skill in the art, may provide a manner of using the spring clip 204, wherein the spring clip 204 does touch the board 208.

Once the heat sink 210 is positioned within the frame clip 202, the spring clip 204 is coupled to the top of the frame clip 202, as explained below. According to the first exemplary embodiment, the spring clip is a "Z-shaped" clip. Once the spring clip 204 is coupled on top of the frame clip 202, the spring clip 204 exerts a force on the heat sink 210. The force presses the heat sink 210 against the heat producing device 206. The force assists the heat sink 210 in maintaining contact with the heat producing device 206 and facilitating the conduction of heat from the heat producing device 206.

The spring clip 204 can be made of a variety of elastic materials for example, but not limited to, plastics, metals, or composites. The spring clip 204 has a spring bias sized to produce a vertical force pressing the heat sink 210 against the heat producing device 206.

Figure 4:
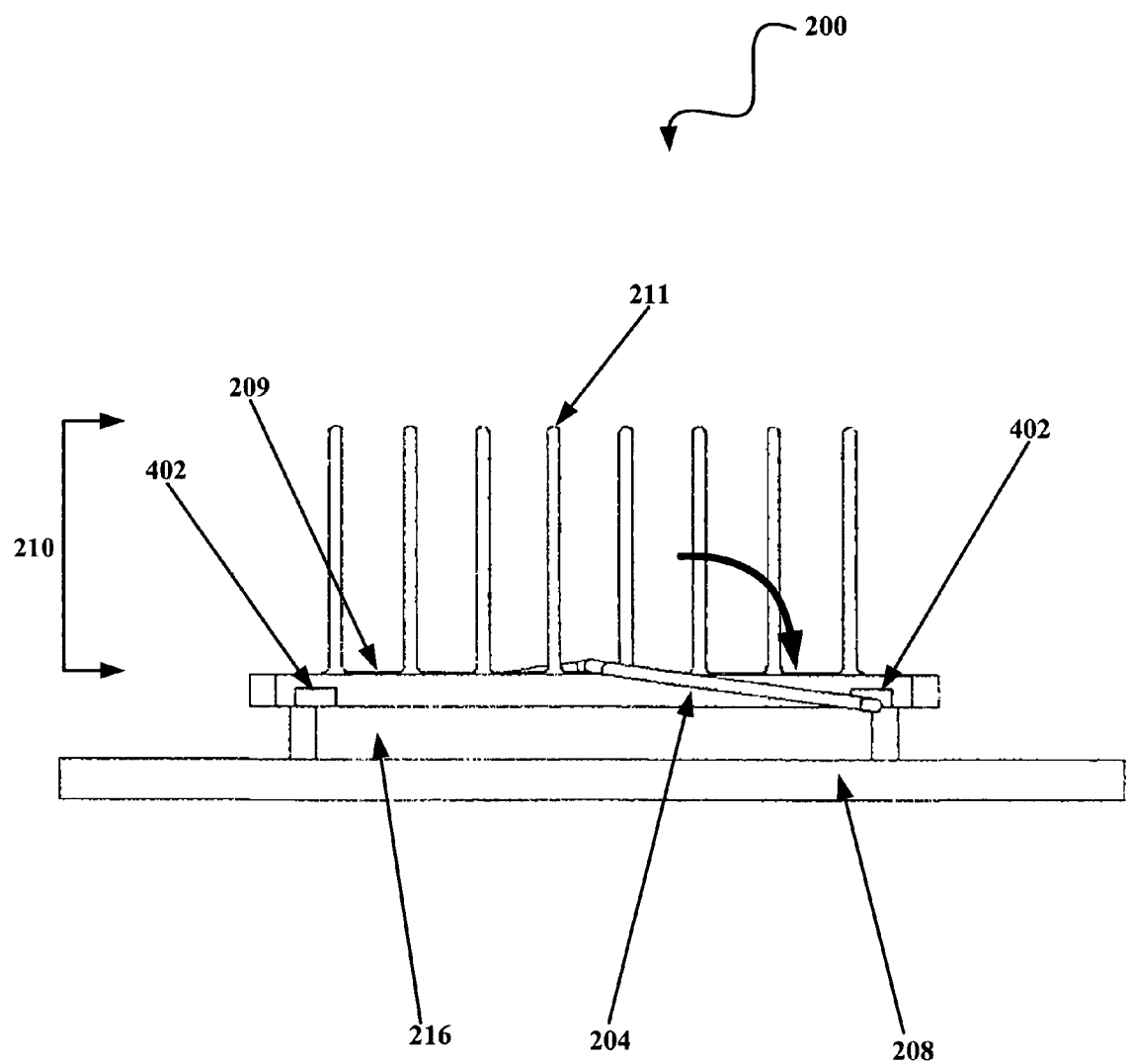
FIG. 4 is a side profile view of the heat sink assembly in accordance with the first exemplary embodiment.
Figure 5:
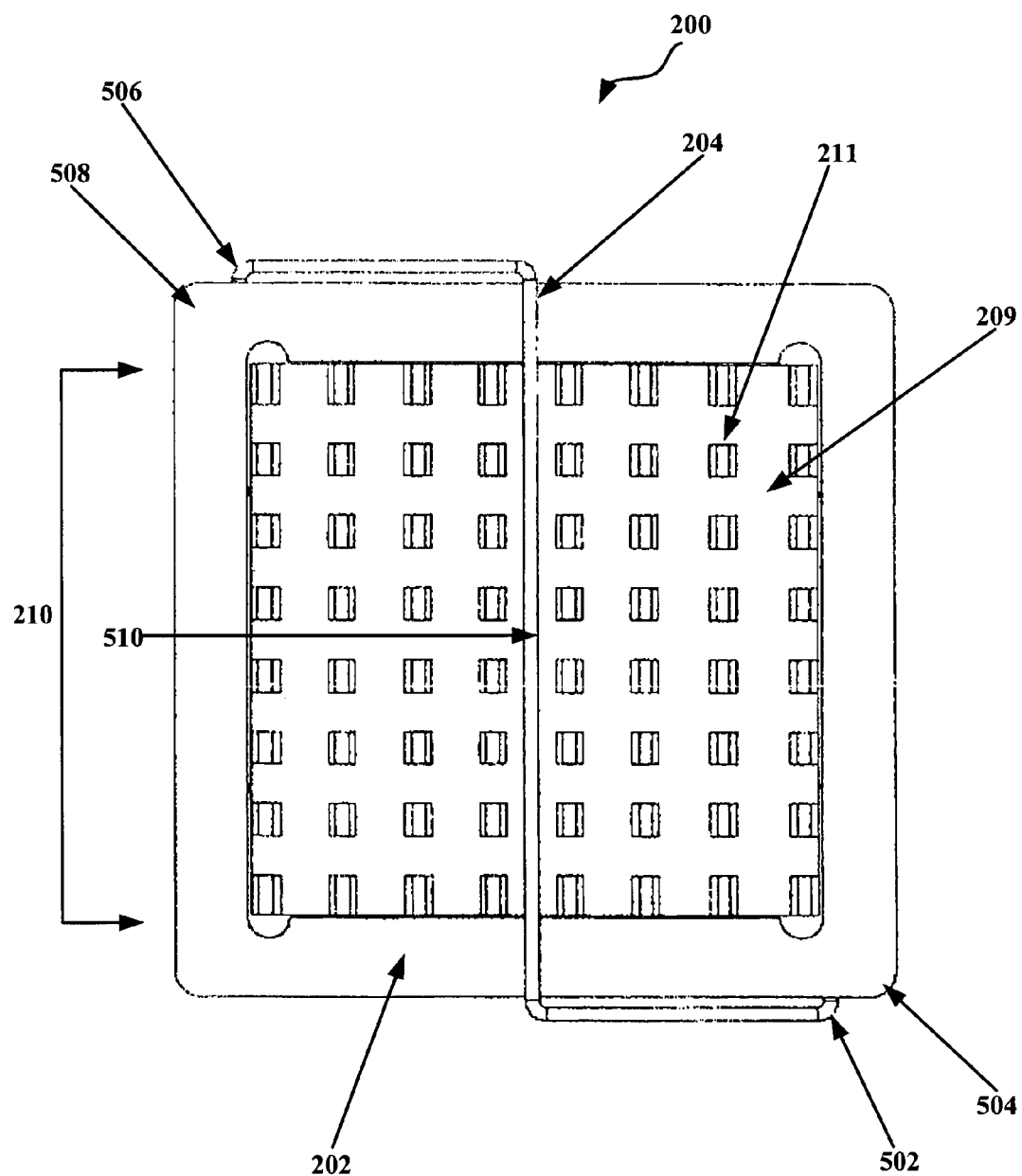
FIG. 5 is a top plane view of the heat sink assembly in accordance with the first exemplary embodiment.

FIG. 4 and 5 are, respectively, a side and top profile view of the heat sink assembly 200 in accordance with the first exemplary embodiment. The spring clip 204, according to the first exemplary embodiment, has a "Z-shape". The "Z-shaped" spring clip 204 has a first end 502 that couples to a first edge 504 of the frame clip 202 and a second end 506 that couples to a second opposite edge 508 of the frame clip 202. The first end 502 of the spring clip 204 is pressed in a downward direction, as shown by the clockwise-curved arrow in FIG. 4, and coupled underneath the first edge 504 of the frame clip 202. Similarly, the second end 506 of the spring clip 204 is coupled underneath the second opposite edge 508 of the frame clip 202. Notches 402 can be provided in edges 504, 508 to prevent the spring clip 204 from shifting horizontally. Coupling the first end 502 of the spring clip 204 and second end 506 of the spring clip 204 to the frame clip 202 puts the spring clip 204 in tension and presses a mid-section 510 of the spring clip 204 against the heat sink 210.

Figure 6:
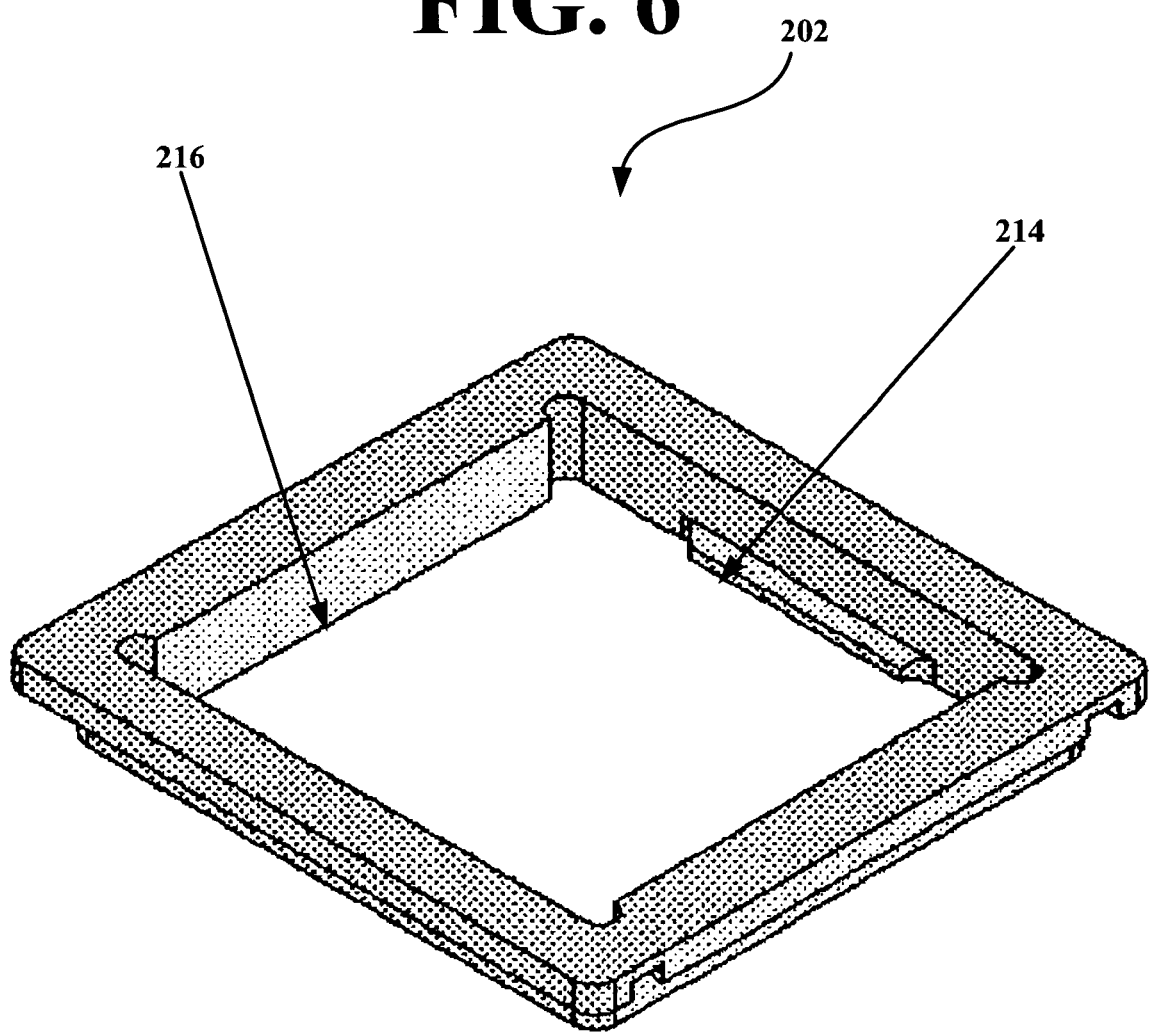
FIG. 6 is a perspective view of the frame clip in accordance with the first exemplary embodiment.
Figure 7:
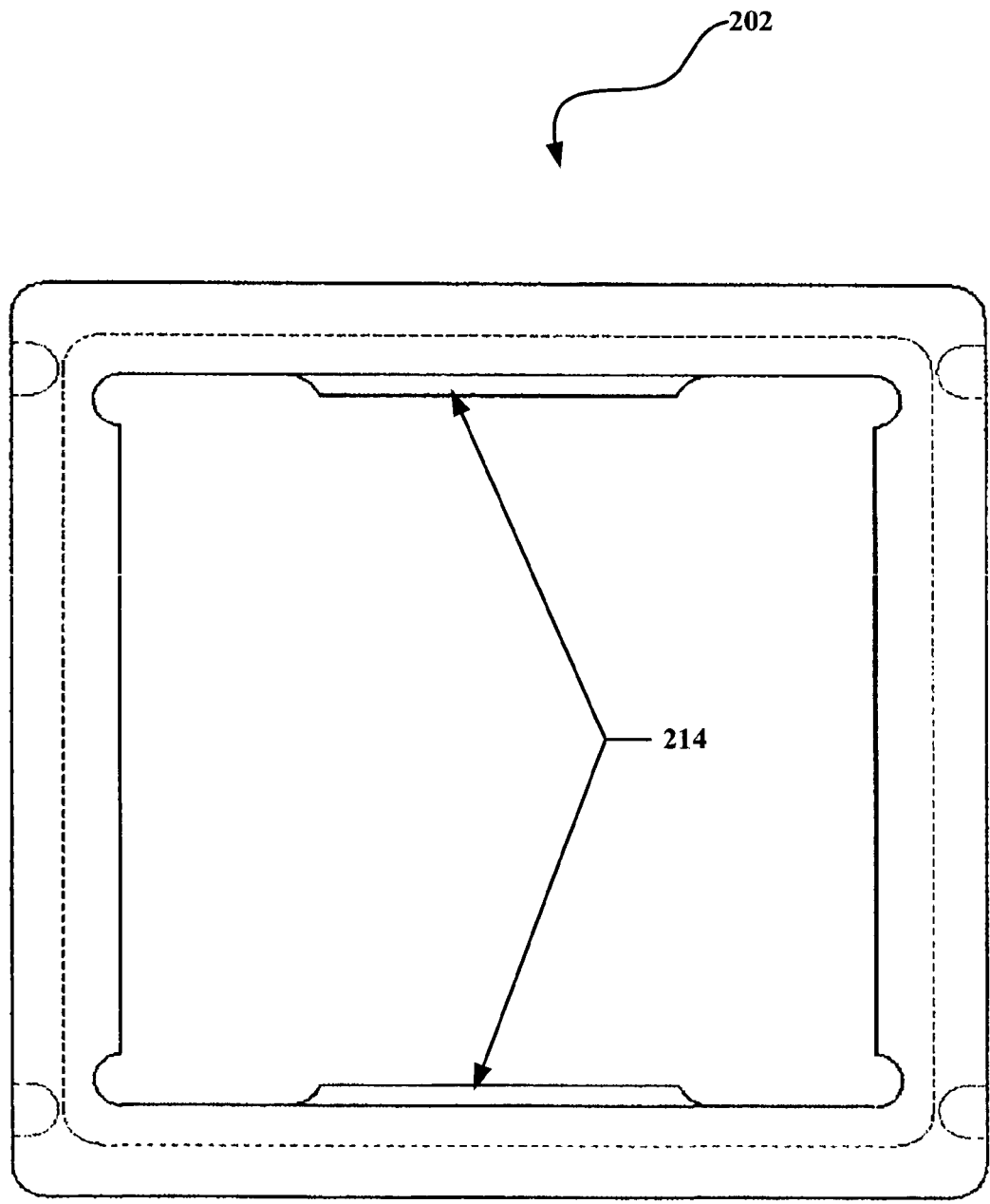
FIG. 7 is a top plane view of the frame clip in accordance with the first exemplary embodiment.
Figure 8:
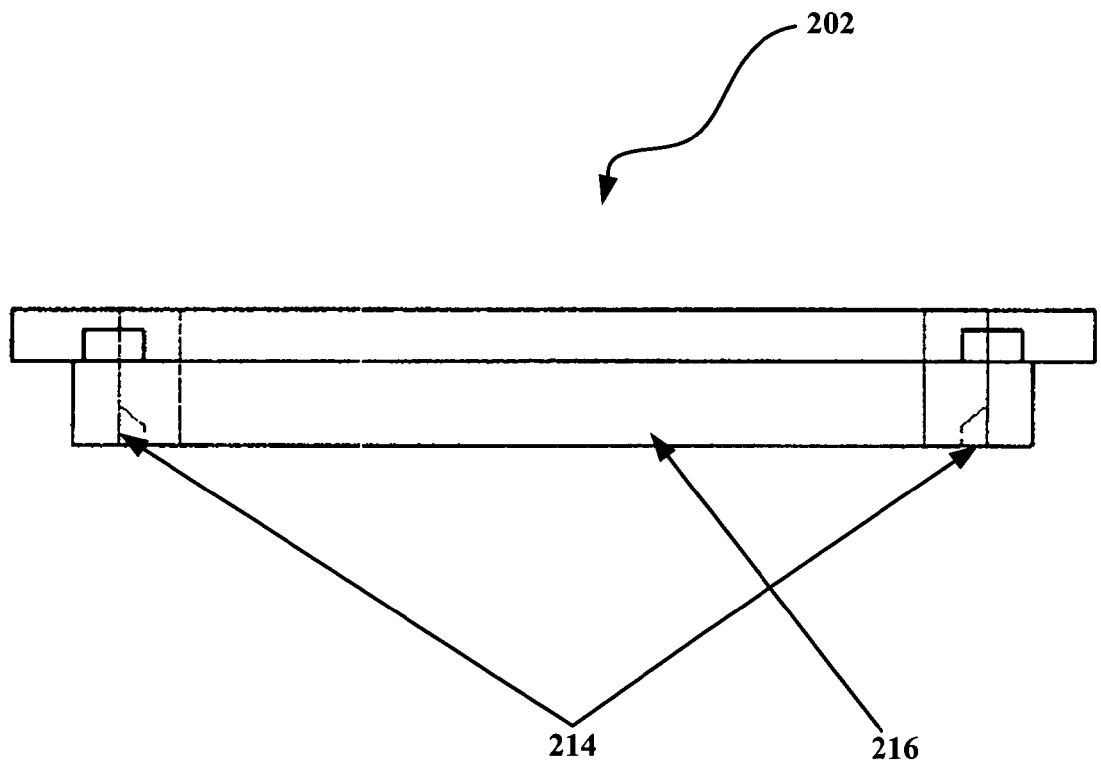
FIG. 8 is a side profile view of the frame clip in accordance with the first exemplary embodiment.

FIGS. 6, 7, and 8, respectively, are a perspective view, top plane view, and side profile view of the frame clip 202 in accordance with the first exemplary embodiment. The frame clip 202 fits over the heat producing device 206. Two or more tabs 214 extend from a base 216 of the frame clip 202 and couple to a bottom edge 218 of the heat producing device 206. The tabs 214 can be positioned opposite each other, or at a location along wall of the base 216, to allow the frame clip 202 to securely couple to the heat producing device 206. The opposing tabs 214 can be spaced a distance apart to allow the base 216 of the frame clip 202 to fit over a top of the heat producing device 206 in an extended or stretched position, while producing a frictional fit to the bottom edge of the heat producing device 206 in a relaxed condition. It should be noted that a modern low profile heat producing device 206 may be gripped by four or more tabs 214 on the frame clip 202, thereby maintaining the position of the low profile heat producing device 206 within the frame clip 202. Alternatively, positioning tabs 214, in specific locations of the frame clip 202 may result in the same function of maintaining the position of the low profile heat producing device 206 within the frame clip 202. It should be noted that, there is no requirement that four or more tabs 214 be used to maintain the position of the low profile heat producing device 206 within the frame clip 202. Instead, positioning the tabs 214 in specific locations of the frame clip 202, even with fewer than four tabs 214, may result in the same function of maintaining the position of the low profile heat producing device 206 within the frame clip 202.

The invention is not limited to the tab structures shown in FIGS. 2-8. A variety of other structures can be used, for example, but not limited to, ridges, protrusion or a frictional fit against the walls of the base 216 of the frame clip 202. The tab structure is not limited to two opposing tabs 214 as shown in FIG. 7. The tab 214 is shown to rise abruptly from the base 216 as shown but the tab 214 may also rise in a tapering manner, depending on a given application, from the base 216. The tab structure may have one or more tabs 214 in addition to the two opposing tabs 214. Additionally, the invention is not limited to the tabs 214 fitting underneath the heat producing device 206. The tabs 214 may, for example, couple to indentations or ridges (not shown) on the side of the heat producing device 206, or various platforms placed on the printed circuit board (board 208) itself, or form a frictional fit against the side walls of the heat producing device 206.

Figure 9:
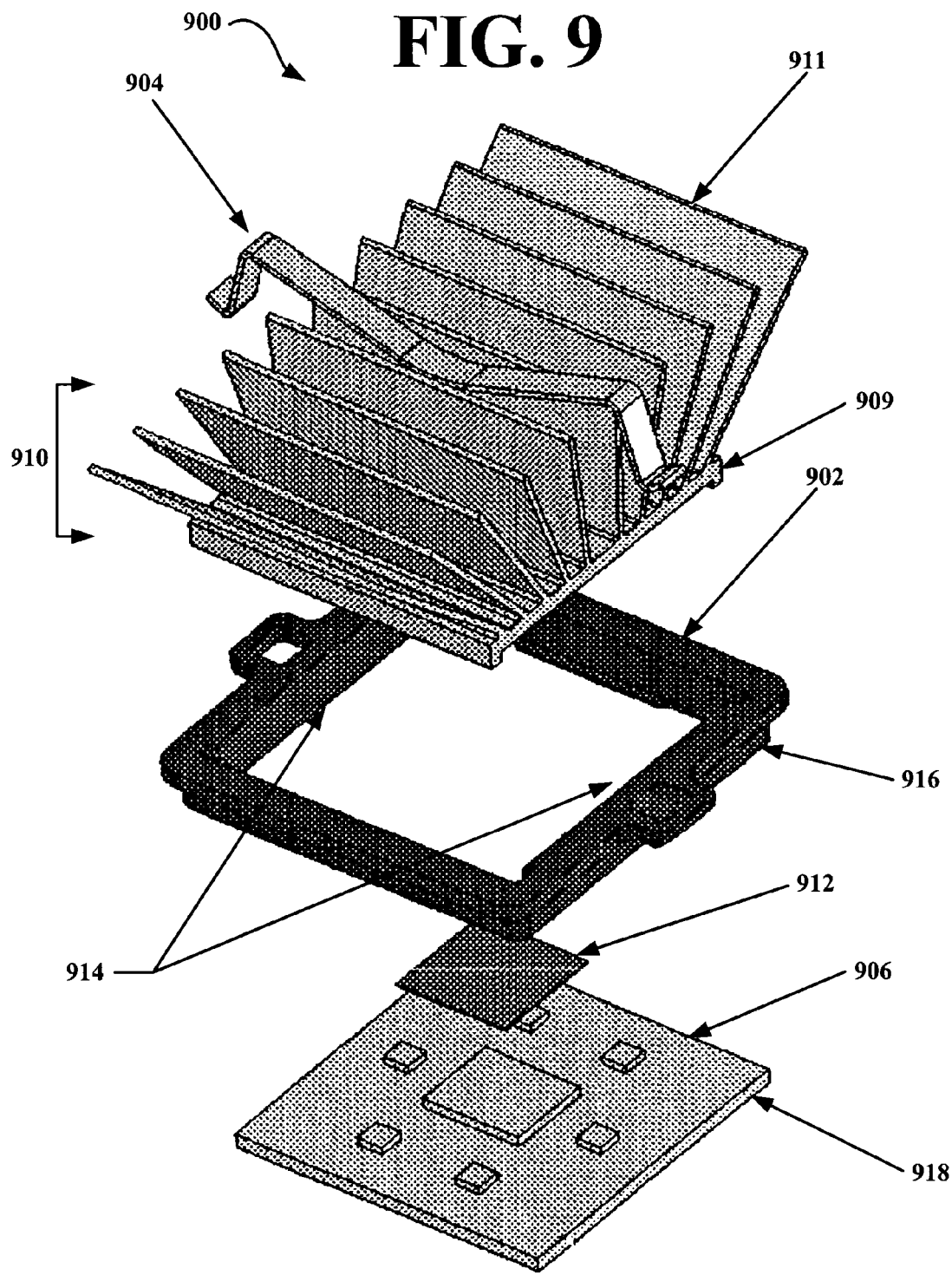
FIG. 9 is an exploded perspective view of a heat sink assembly in accordance with a second exemplary embodiment.
Figure 10:
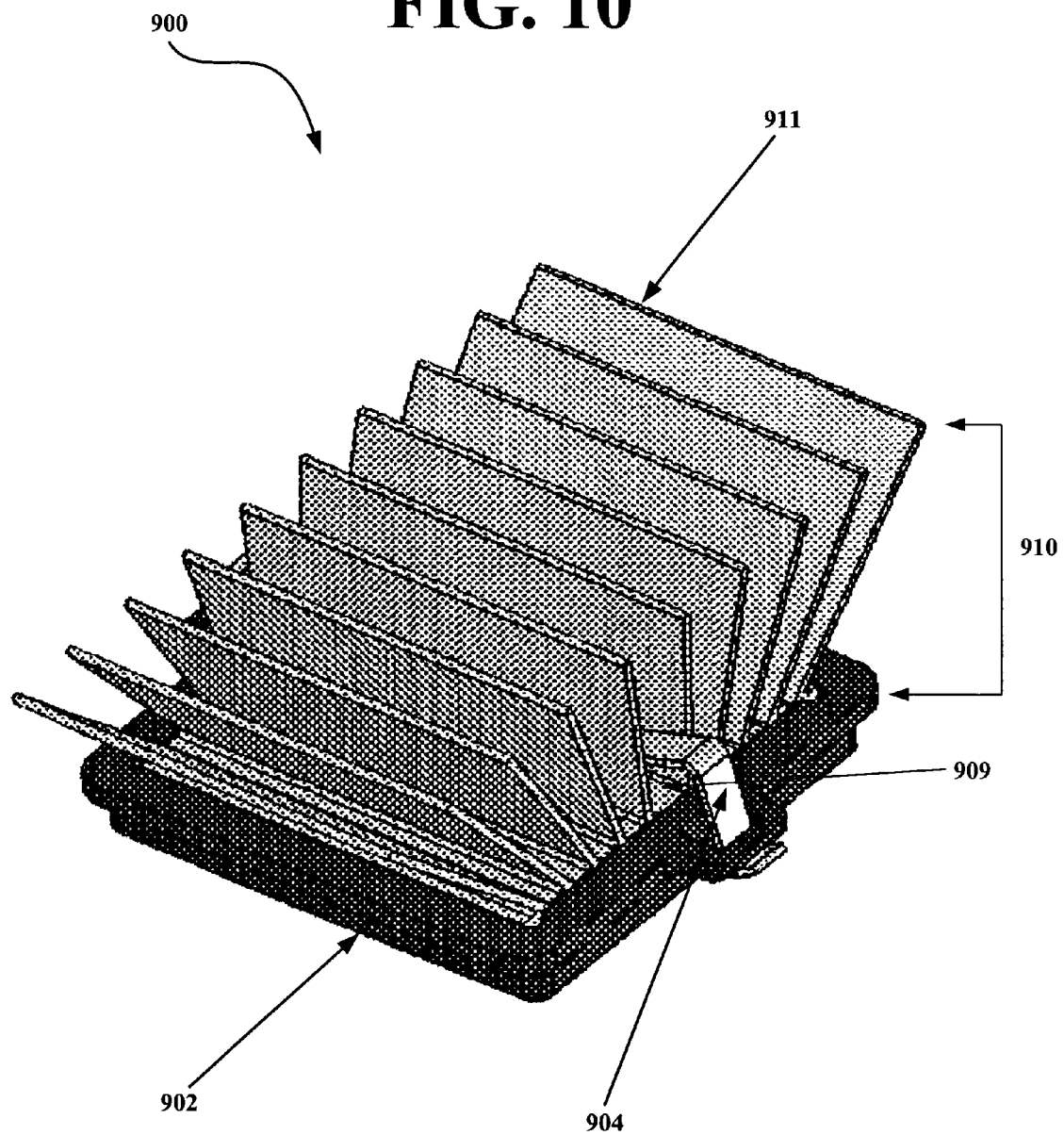
FIG. 10 is an assembled perspective view of the heat sink assembly in accordance with the second exemplary embodiment.

FIG. 9 and FIG. 10 are, respectively, an exploded and assembled perspective view of a heat sink assembly 900 in accordance with a second exemplary embodiment of the invention. The heat sink assembly 900, has a frame clip 902 and a spring clip 904. A heat producing device 906 can be coupled to a board or other support structure (not shown). A heat sink 910 is used to dissipate heat from the heat producing device 906. The heat sink 910 has a base 909 portion and a top fin 911 portion. Individual fins 911 may vary in length and individual fins 911 may be at varying angles with respect to the base 909. The heat sink 910 can be positioned against the heat producing device 906. The heat is transferred from the heat producing device 906 to the heat sink 910 by conduction. A thermally conductive layer 912 can be placed in between the heat sink 910 and the heat producing device 906 to aid in the conduction of heat.

The frame clip 902 of the second exemplary embodiment fits over the heat producing device 906. Tabs 914 extend from a base 916 of the frame clip 902 and couple to a bottom edge 918 of the heat producing device 906. The heat sink 910 fits within the frame clip 902. The spring clip 904 removably couples to the frame clip 902 as explained below.

Once the heat sink 910 is positioned within the frame clip 902, the spring clip 904 is coupled to the top of the frame clip 902. According to the second exemplary embodiment, the spring clip 904 is an "M-shaped" clip. Once the spring clip 904 is coupled on top of the frame clip 902, the spring clip 904 exerts a force on the heat sink 910. The force is exerted in a downward direction, pressing the heat sink 910 against the heat producing device 906. The force assists the heat sink 910 in maintaining contact with the heat producing device 906 and facilitating the conduction of heat from the heat producing device 906.

The spring clip 904 of the second exemplary embodiment can be made of a variety of elastic materials, for example, but not limited to, plastics, metals, or composites. The spring clip 904 has a spring bias sized to produce a vertical force pressing the heat sink 910 against the heat producing device 906.

Figure 11:
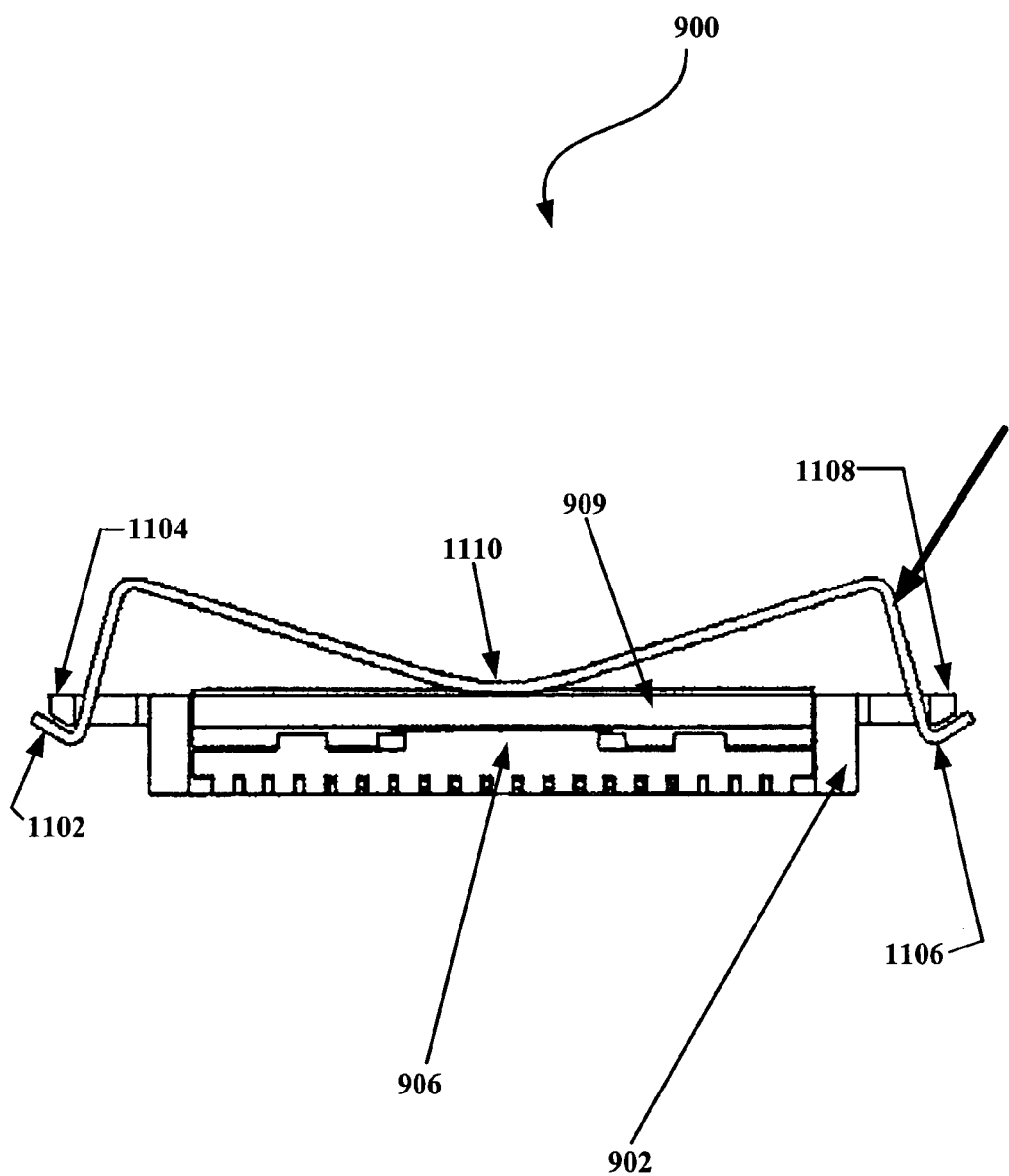
FIG. 11 is a side profile view of the heat sink assembly in accordance with the second exemplary embodiment.
Figure 12:
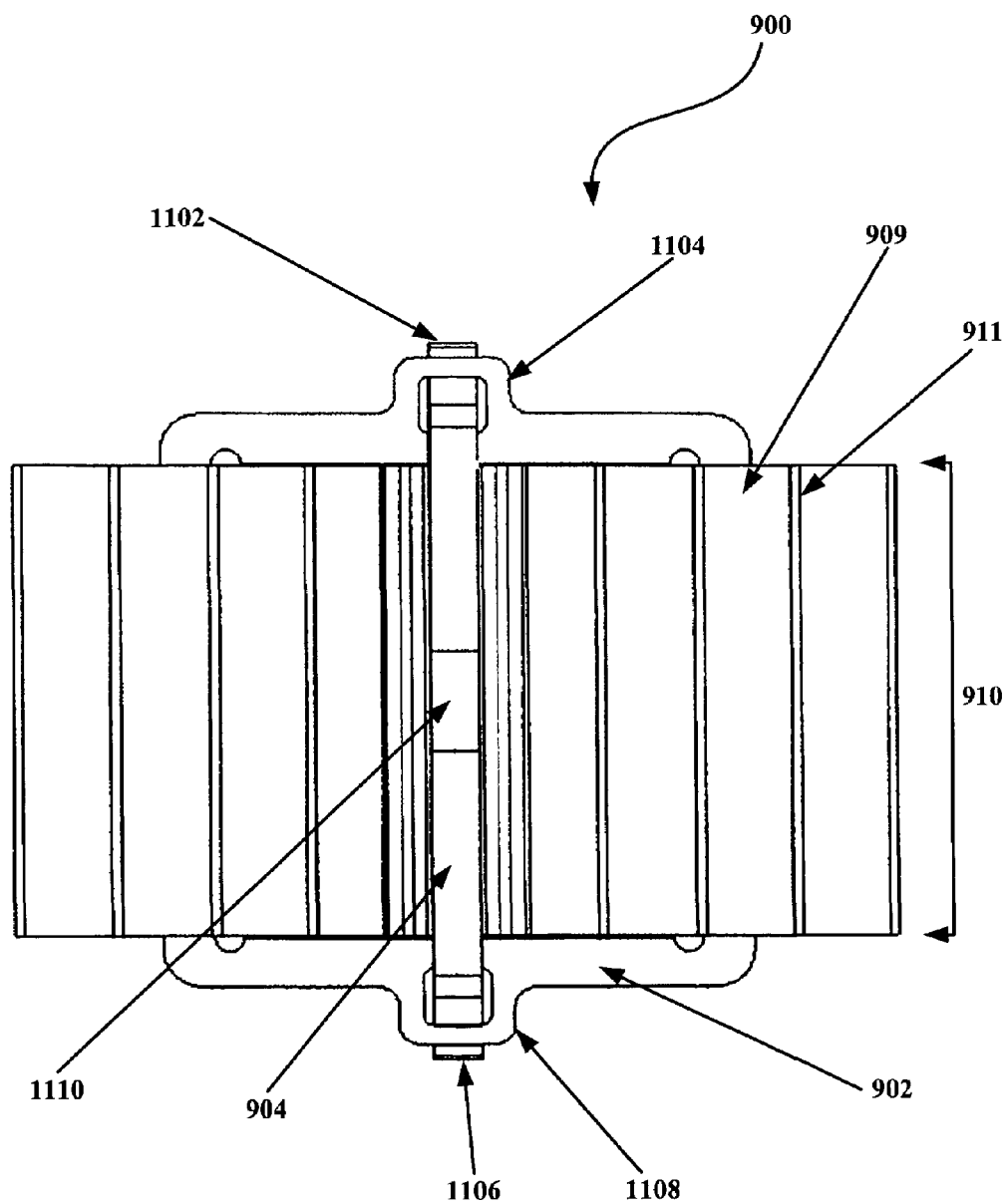
FIG. 12 is a top plane view of the heat sink assembly in accordance with the second exemplary embodiment.

FIG. 11 and FIG. 12 are, respectively, a side cross-sectional view and top profile view of the heat sink assembly 900 in accordance with the second exemplary embodiment. In FIG. 11, the fins 911 are not shown to facilitate a clearer illustration of the spring clip 904. The "M-shaped" spring clip 904 has a first end 1102 that couples to a first handle 1104 of the frame clip 902 and a second end 1106 that couples to a second handle 1108 of the frame clip 902. The first end 1102 of the spring clip 904 is threaded through the first handle 1104 of the frame clip 902. The second end 1106 of the spring clip 904 is pressed in a down and inward direction, as shown by the arrow in FIG. 11, and coupled underneath the second handle 1108 of the frame clip 902. Coupling the first end 1102 and second end 1106 to the frame clip 902 puts the spring clip 904 in tension and presses a mid-section 1110 of the spring clip 904 against the heat sink 910. The first handle 1104 and second handle 1108 of the frame clip 902 are not limited to the exemplary structures shown in FIGS. 9-15. A variety of other handle structures can be provided to couple the first end 1102 and the second end 1106 of the spring clip 904. As an example, the first end 1102 and second end 1106 of the spring clip 904 may extend inward and clip to a ridge (not shown) underneath the frame clip 902.

Figure 13:
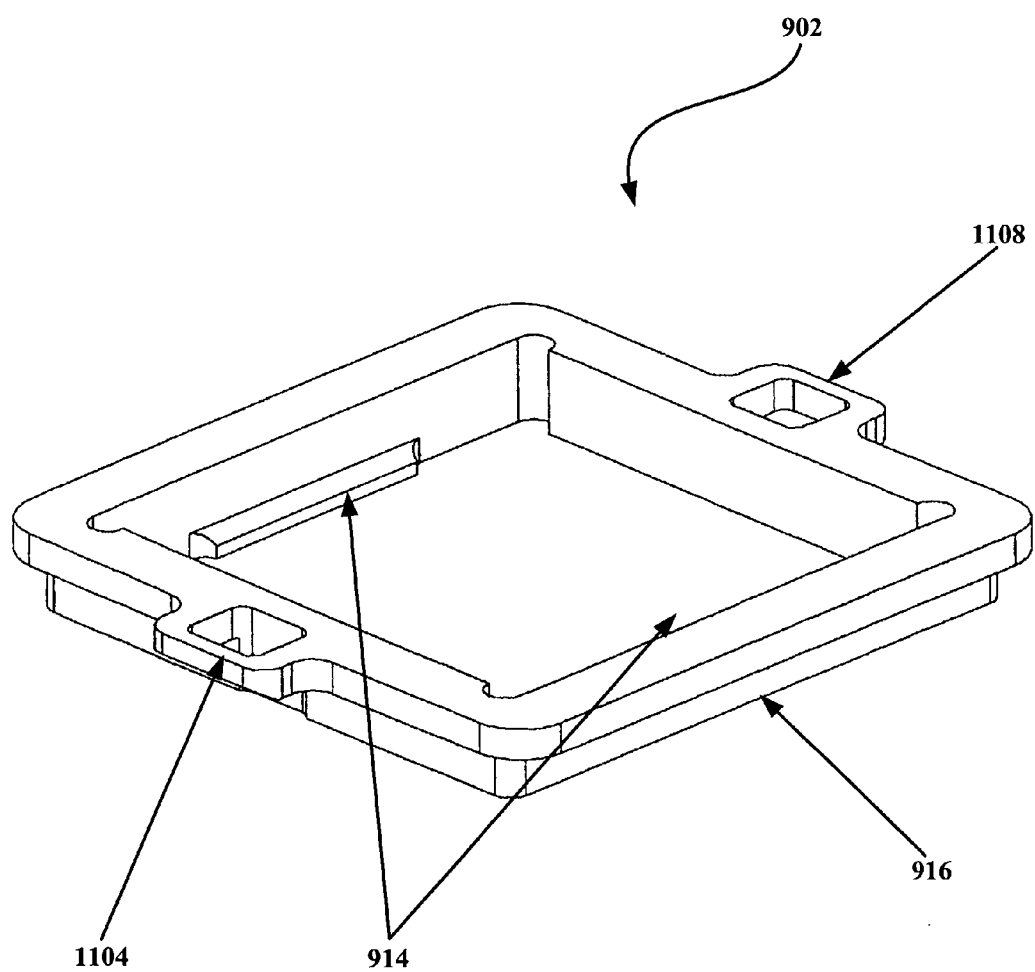
FIG. 13 is a perspective view of the frame clip in accordance with the second exemplary embodiment.
Figure 14:
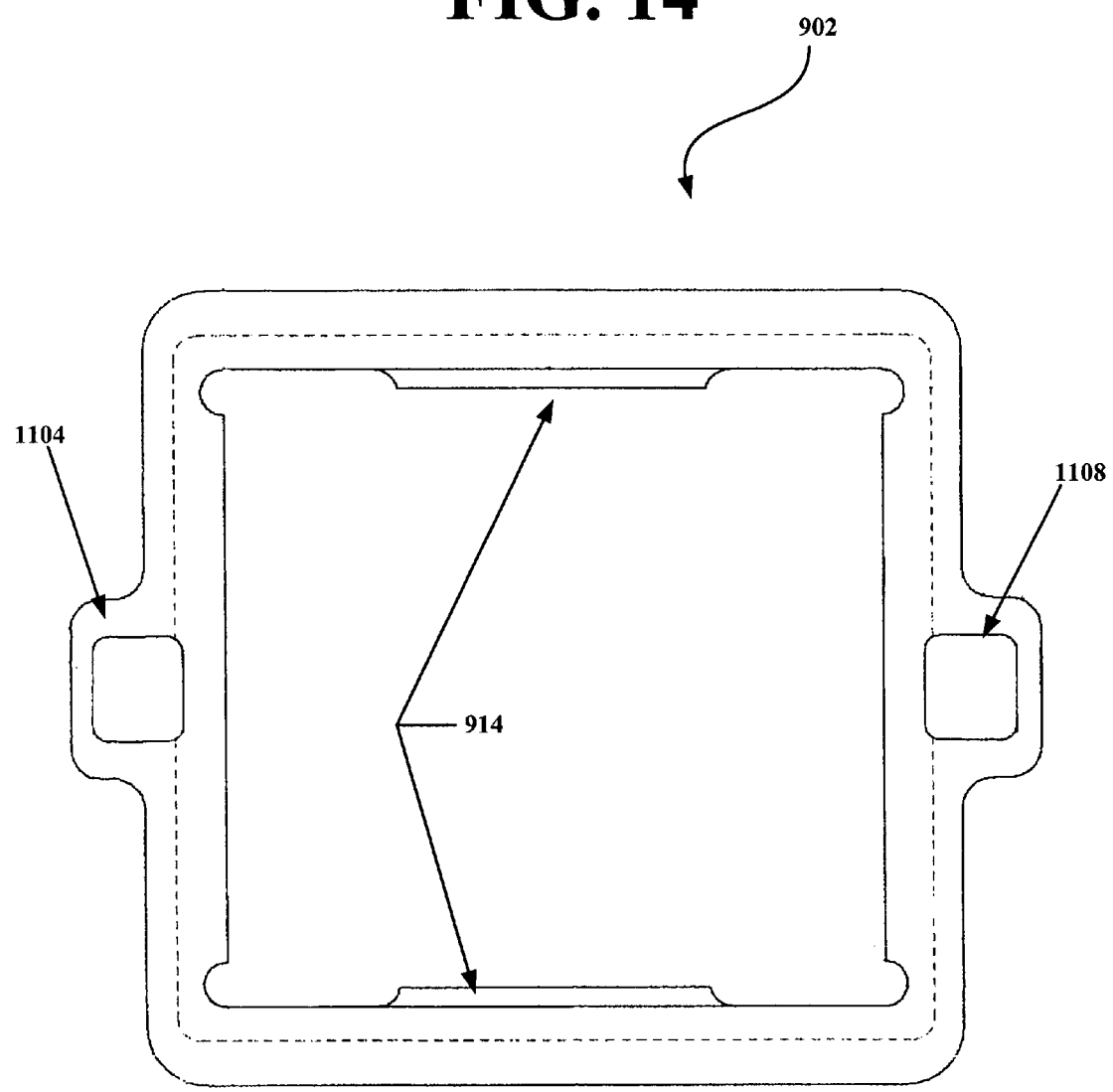
FIG. 14 is a top plane view of the frame clip in accordance with the second exemplary embodiment.
Figure 15:
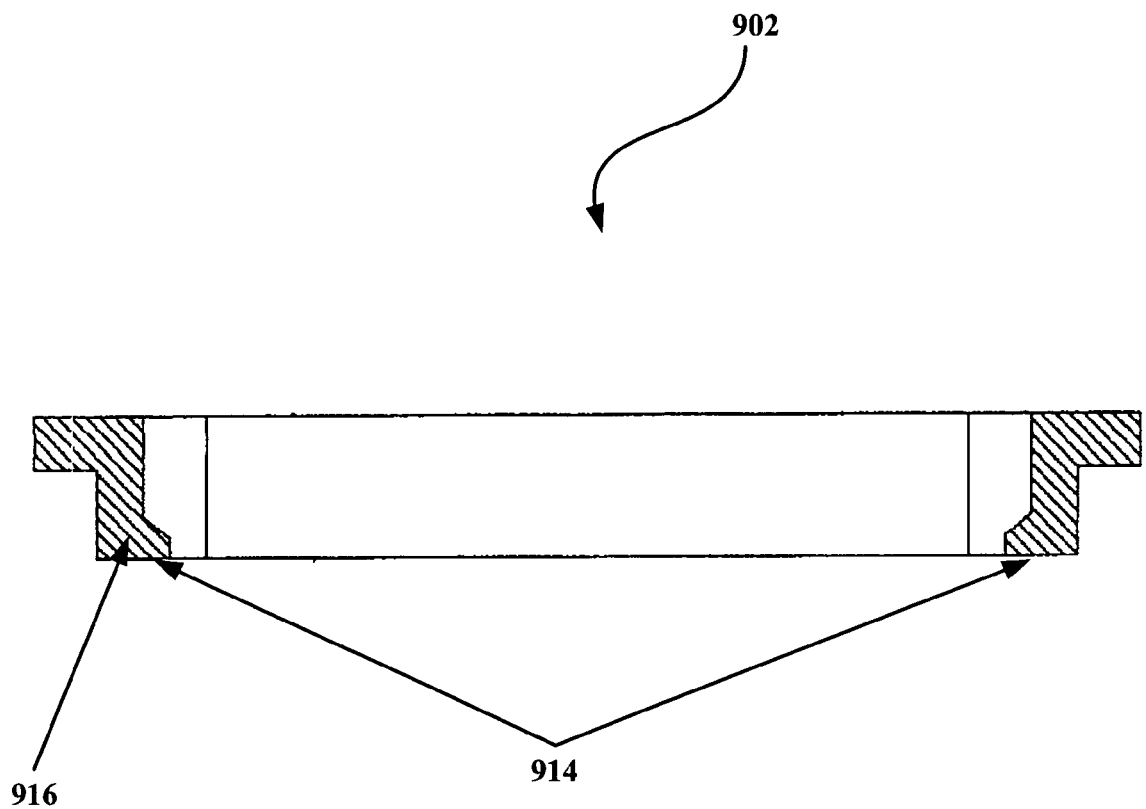
FIG. 15 is a side profile view of the frame clip in accordance with the second exemplary embodiment.

FIGS. 13, 14, and 15, respectively, are a perspective view, top plane view, and side profile view of the frame clip 902, in accordance with the second exemplary embodiment. The frame clip 902 fits over the heat producing device 906. Two or more tabs 914 extend from a base 916 of the frame clip 902 and couple to a bottom edge 918 of the heat producing device 906. The tabs 914 can be positioned opposite each other to allow the frame clip 902 to securely couple to the heat producing device 906. The opposing tabs 914 can be spaced a distance apart to allow the base 916 of the frame clip 902 to fit over a top of the heat producing device 906 in an extended or stretched position, while producing a frictional fit to the bottom edge 918 of the heat producing device 906 in a relaxed condition. The invention is not limited to the tab structures shown in FIGS. 9-15. A variety of other structures can be used, e.g., the tab 914 is shown to rise abruptly from the base 916 but the tab 914 may also rise in a tapering manner, depending on a given application, from the base 916.

Figure 16:
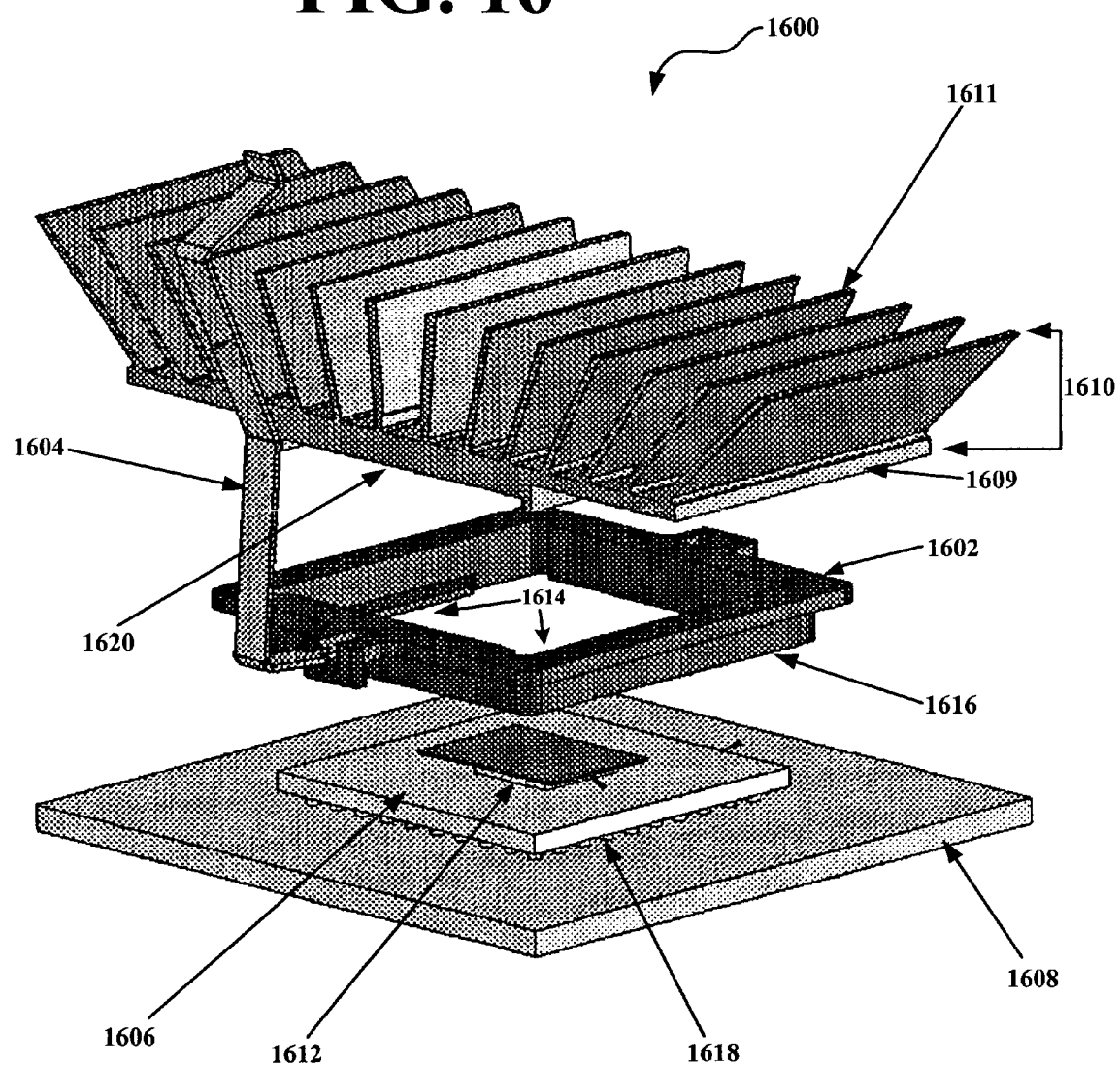
FIG. 16 is an exploded perspective view of a heat sink assembly in accordance with a third exemplary embodiment.
Figure 17:
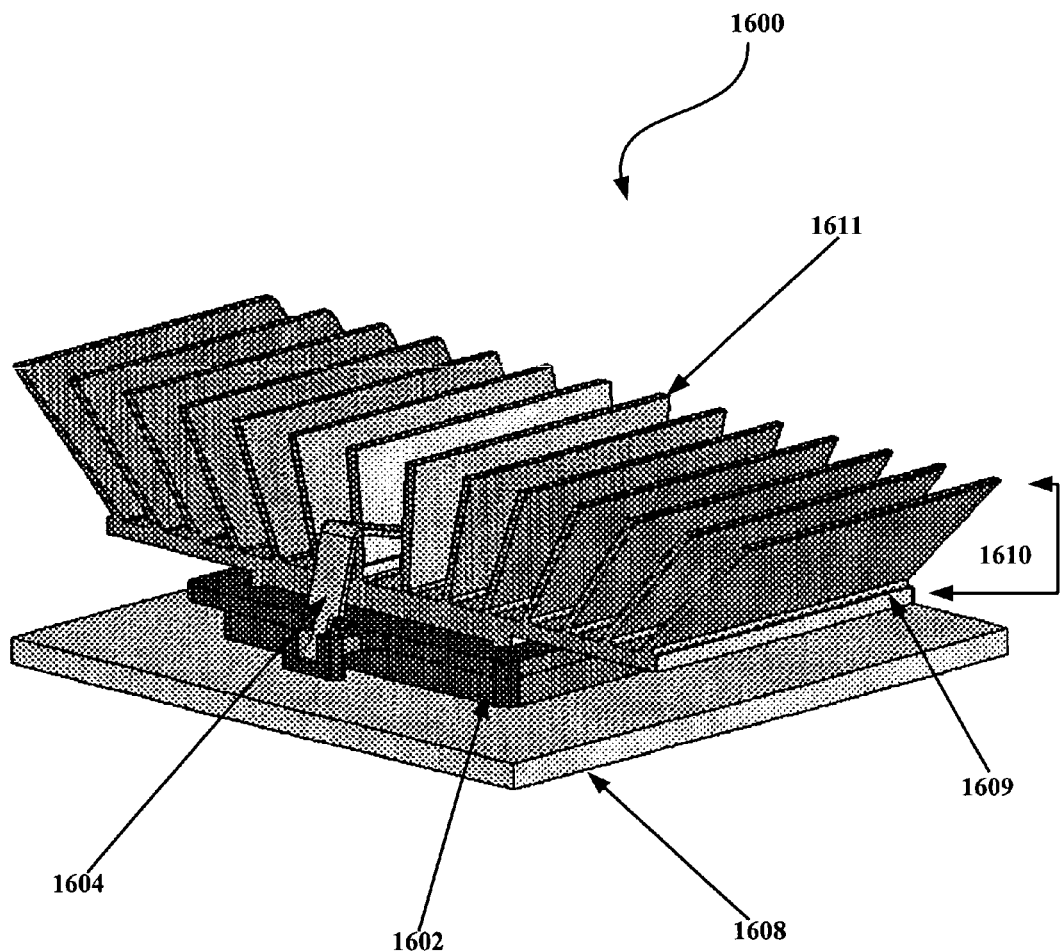
FIG. 17 is an assembled perspective view of the heat sink assembly in accordance with the third exemplary embodiment.

FIG. 16 and FIG. 17 are, respectively, an exploded and assembled perspective view of a heat sink assembly 1600, in accordance with a third exemplary embodiment of the invention. The heat sink assembly 1600 has a frame clip 1602 and a spring clip 1604. A heat producing device 1606 can be coupled to a board 1608 or other support structure. The board 1608 can be a variety of other devices. A heat sink 1610 is used to dissipate heat from the heat producing device 1606. The heat sink 1610 has a base 1609 portion and a top fin 1611 portion. Individual fins 1611 may vary in length and individual fins 1611 may be at varying angles with respect to the base 1609. The heat sink 1610 can be positioned against the heat producing device 1606. Heat is transferred from the heat producing device 1606 to the heat sink 1610 by conduction. A thermally conductive layer 1612 can be placed between the heat sink 1610 and the heat producing device 1606 to aid in the conduction of heat.

The frame clip 1602 of the third exemplary embodiment fits over the heat producing device 1606. Tabs 1614 extend from a base 1616 of the frame clip 1602 and couple to a bottom edge 1618 of the heat producing device 1606. A base 1620 of the heat sink 1610 fits within the frame clip 1602. The spring clip 1604 rotatably couples to the frame clip 1602. The base 1616 of the frame clip 1602 can rest against the 1608 board. The frame clip 1602 can prevent the transfer of weight or accidental forces placed on the heat sink 1610. Once the base 1620 of the heat sink 1610 is positioned within the frame clip 1602, the spring clip 1604 is rotatable about the top of the frame clip 1602. According to the third exemplary embodiment, the spring clip 1604 is an "M-shaped" clip that is rotatably coupled to the frame clip 1602. Once the spring clip 1604 is coupled on top of the frame clip 1602, the spring clip 1604 exerts a force on the heat sink 1610. The force presses the heat sink 1610 against the heat producing device 1606. The force assists the heat sink 1610 in maintaining contact with the heat producing device 1606 and facilitating the conduction of heat from the heat producing device 1606. The spring clip 1604 has a spring bias sized to produce a vertical force pressing the heat sink 1610 against the heat producing device 1606. The spring clip 1604 of the third exemplary embodiment can be made of a variety of elastic materials, for example, but not limited to, plastics, metals, or composites.

Figure 18:
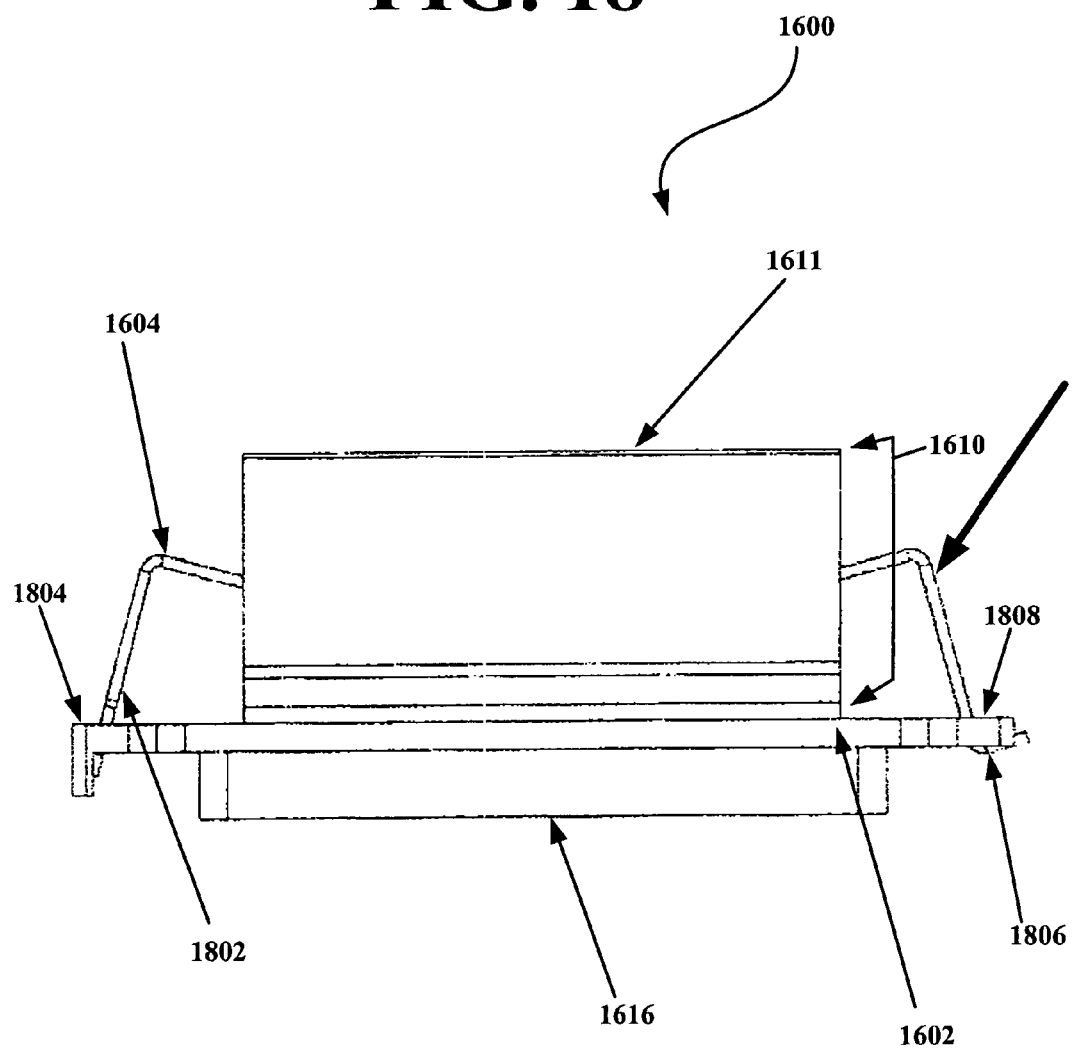
FIG. 18 is a side profile view of the heat sink assembly in accordance with the third exemplary embodiment.
Figure 19:
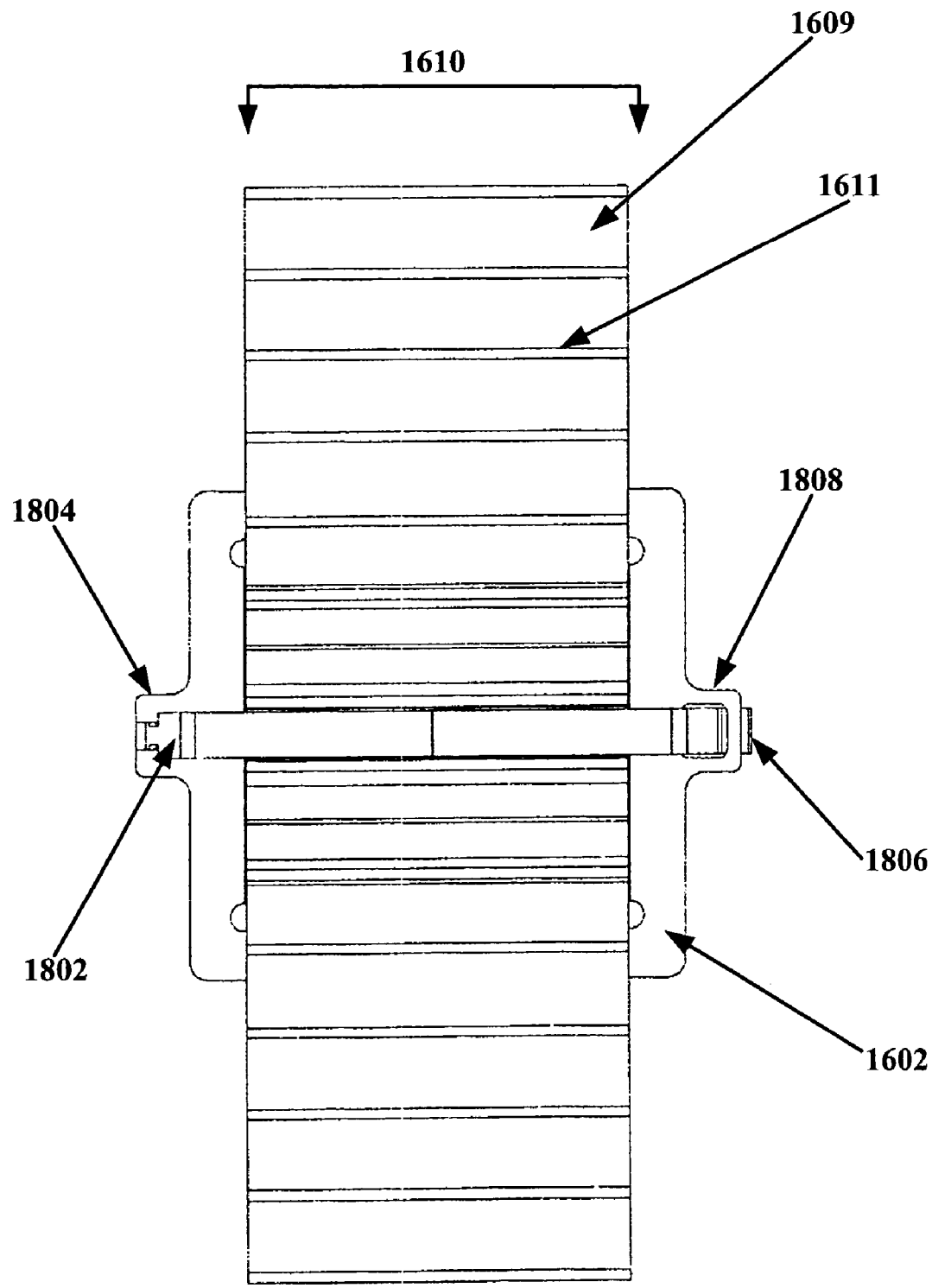
FIG. 19 is a top plane view of the heat sink assembly in accordance with the third exemplary embodiment.
Figure 20:
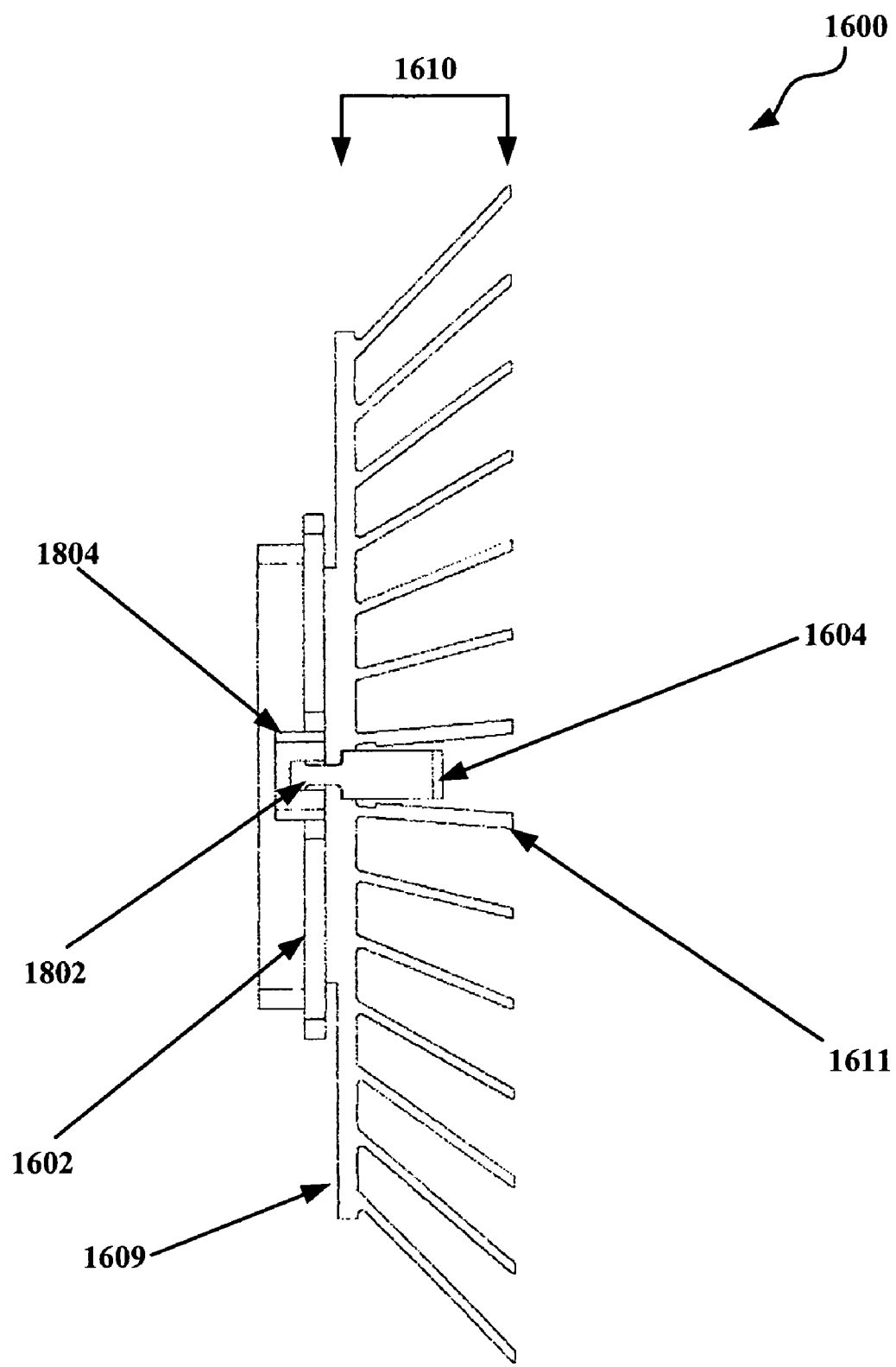
FIG. 20 is a front profile view of the heat sink assembly in accordance with the third exemplary embodiment.
Figure 21:
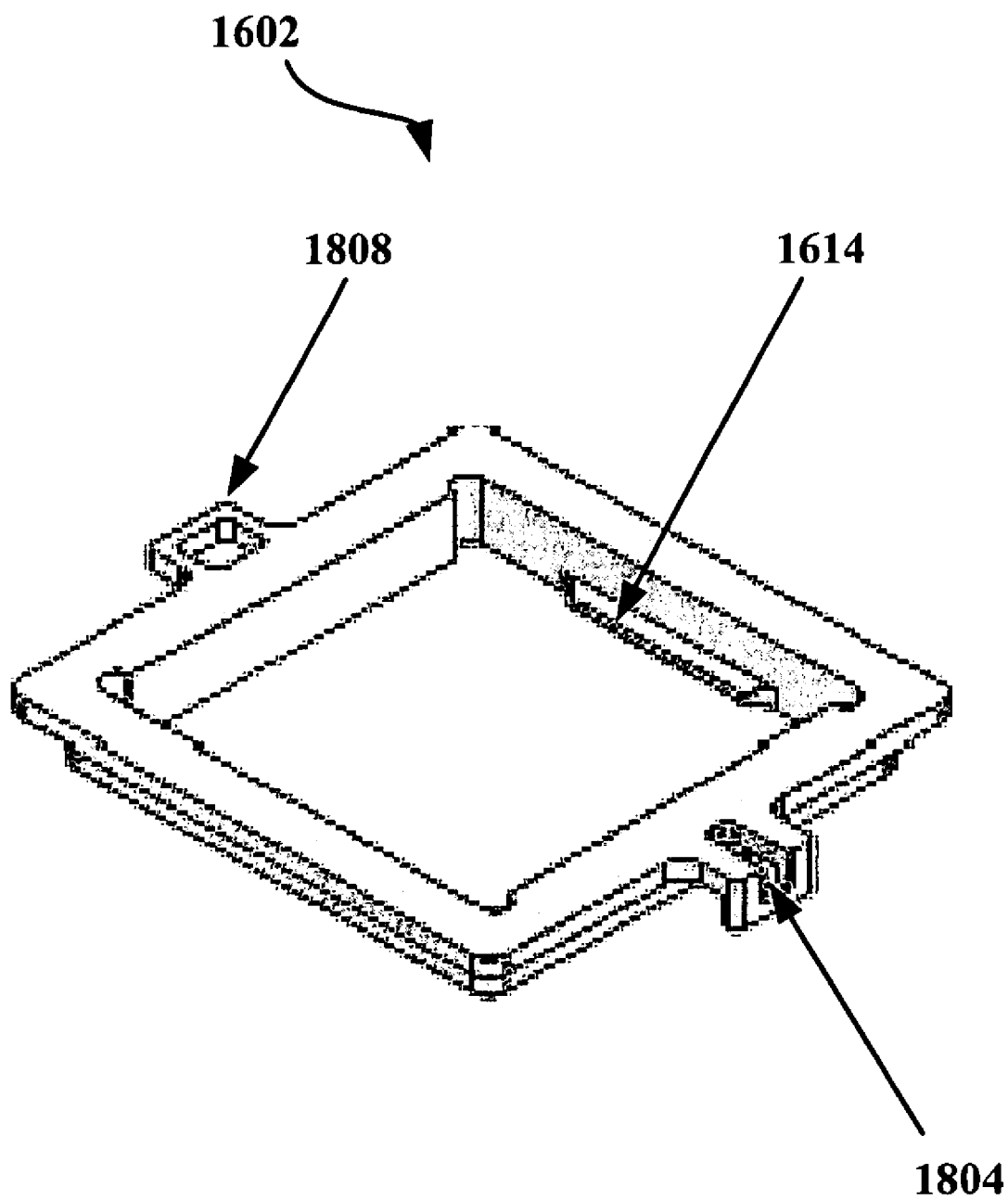
FIG. 21 is a perspective view of the frame clip in accordance with the third exemplary embodiment.
Figure 22:
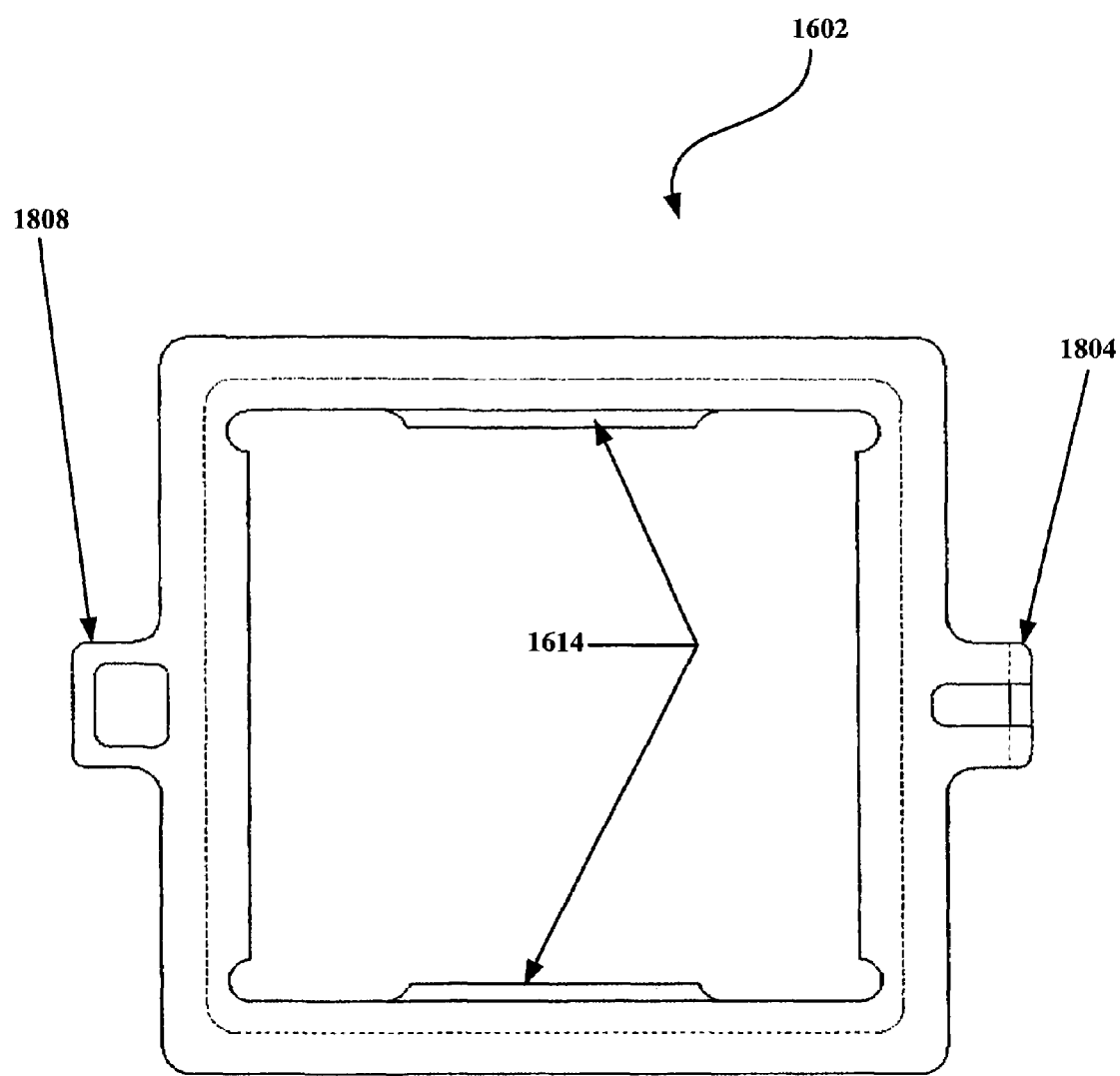
FIG. 22 is a top plane view of the frame clip in accordance with the third exemplary embodiment.
Figure 23:
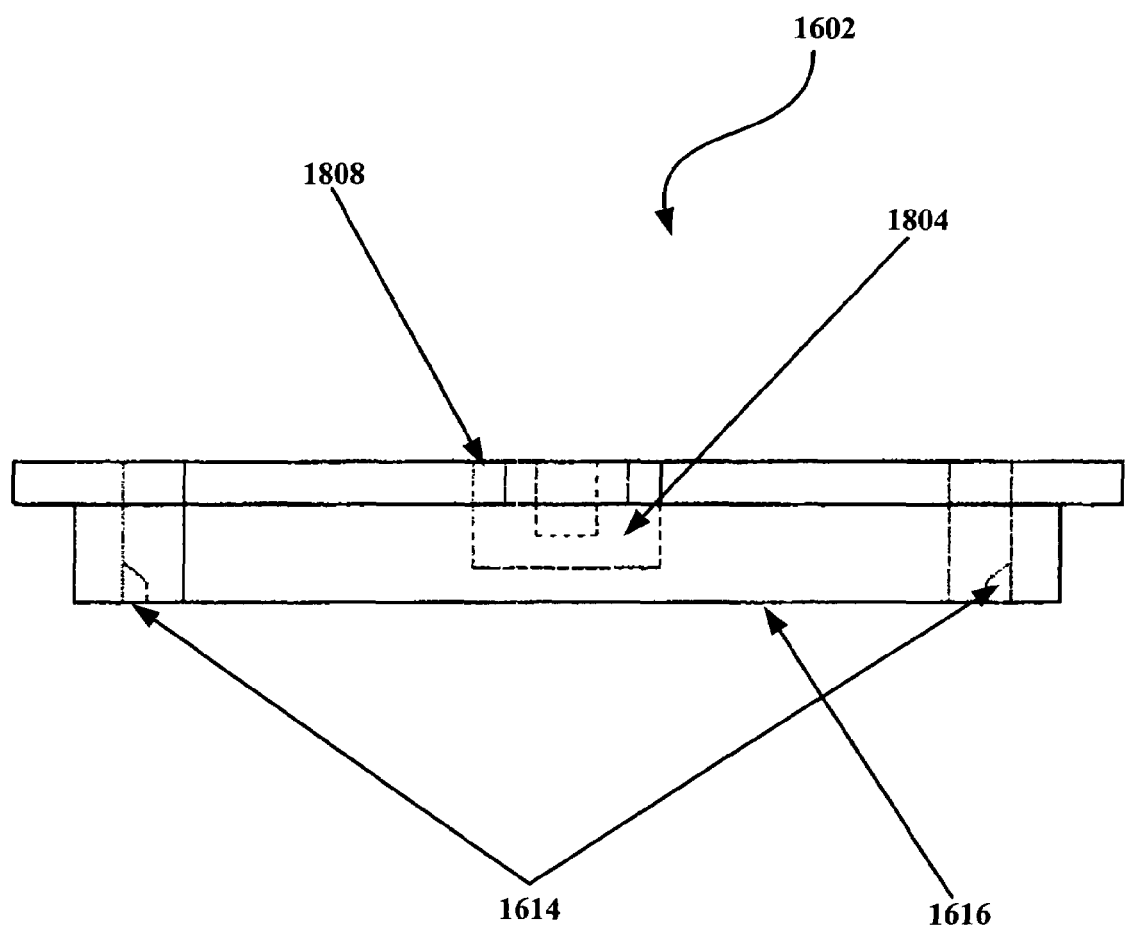
FIG. 23 is a side profile view of the frame clip in accordance with the third exemplary embodiment.
Figure 24:
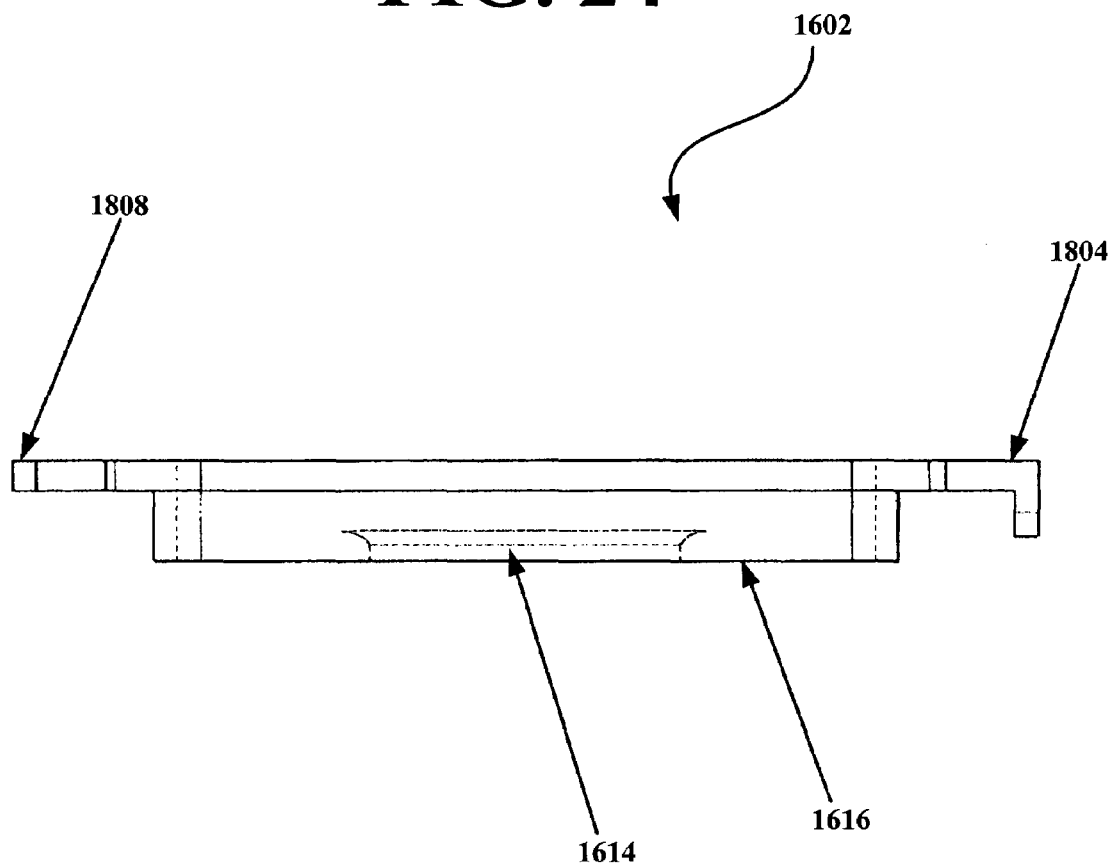
FIG. 24 is a front profile view of the frame clip in accordance with the third exemplary embodiment.

FIG. 18, 19, and 20 are, respectively, a side, top, and front profile view of the heat sink assembly 1600 in accordance with the third exemplary embodiment. The "M-shaped" clip 1604 has a first end 1802 that rotatably couples to a first handle 1804 of the frame clip 1602 and a second end 1806 that removably couples to a second opposite handle 1808 of the frame clip 1602. The first end 1802 is hinged to the first handle 1804. The hinging of the first end 1802 as shown in the third exemplary embodiment, is an example of a hinge that may be used; other hinging structures can be used and are within the scope of the invention. The second end 1806 is pressed in a down and inward direction, as shown by the arrow in FIG. 18, and coupled underneath the second handle 1808 of the frame clip 1602. Coupling the first end 1802 and second end 1806 to the frame clip 1602 puts the spring clip 1604 in tension and presses a mid-section (not shown) of the spring clip 1604 against the heat sink 1610. The first handle 1804 and second handle 1808 are not limited to the exemplary structures shown in FIGS. 16-24. A variety of other handle structures can be provided to couple the first end 1802 and the second end 1806 of the spring clip 1604.

FIGS. 21, 22, 23, and 24, respectively, are a perspective view, top plane view, side profile view, and front profile view of the frame clip 1602 in accordance with the third exemplary embodiment. The frame clip 1602 fits over the heat producing device 1606. Two or more tabs 1614 extend from a base 1616 of the frame clip 1602 and couple to a bottom edge 1618 of the heat producing device 1606. The tabs 1614 can be positioned opposite each other to allow the frame clip 1602 to securely couple to the heat producing device 1606. The distance between the opposing tabs 1614 can be spaced a distance apart to allow the base 1616 of the frame clip 1602 to fit over top of the heat producing device 1606 in an extended or stretched position, while producing a frictional fit to the bottom edge 1618 of the heat producing device 1606 in a relaxed condition. The invention is not limited to the tab structures shown in FIGS. 16-24. A variety of other tab structures can be used, e.g., the tab 1614 is shown to rise abruptly from the base 1616 but the tab 1614 may also rise in a tapering manner, depending on a given application, from the base 1616.

Figure 25:
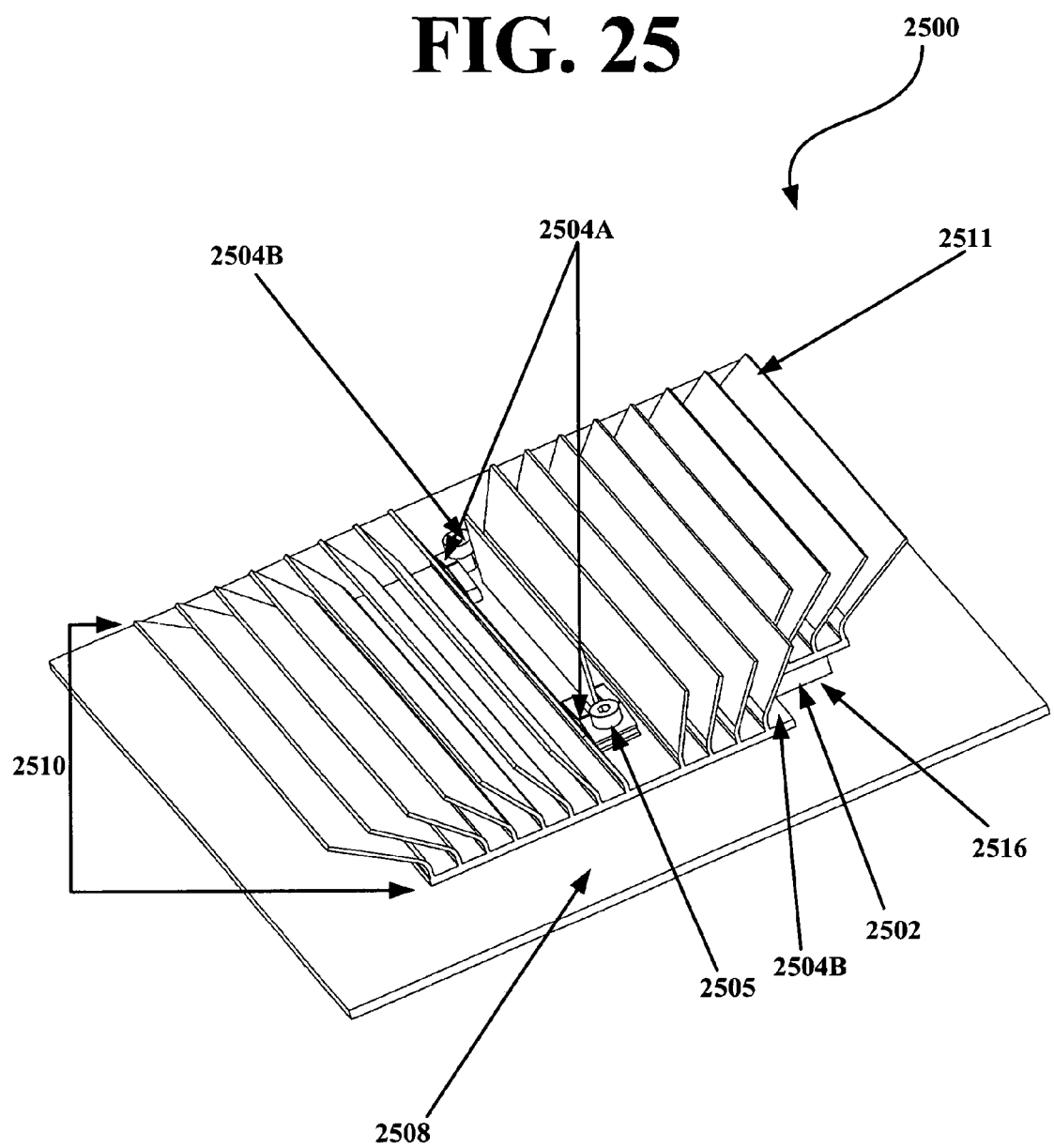
FIG. 25 is an assembled perspective view of a heat sink assembly in accordance with a fourth exemplary embodiment.
Figure 26:
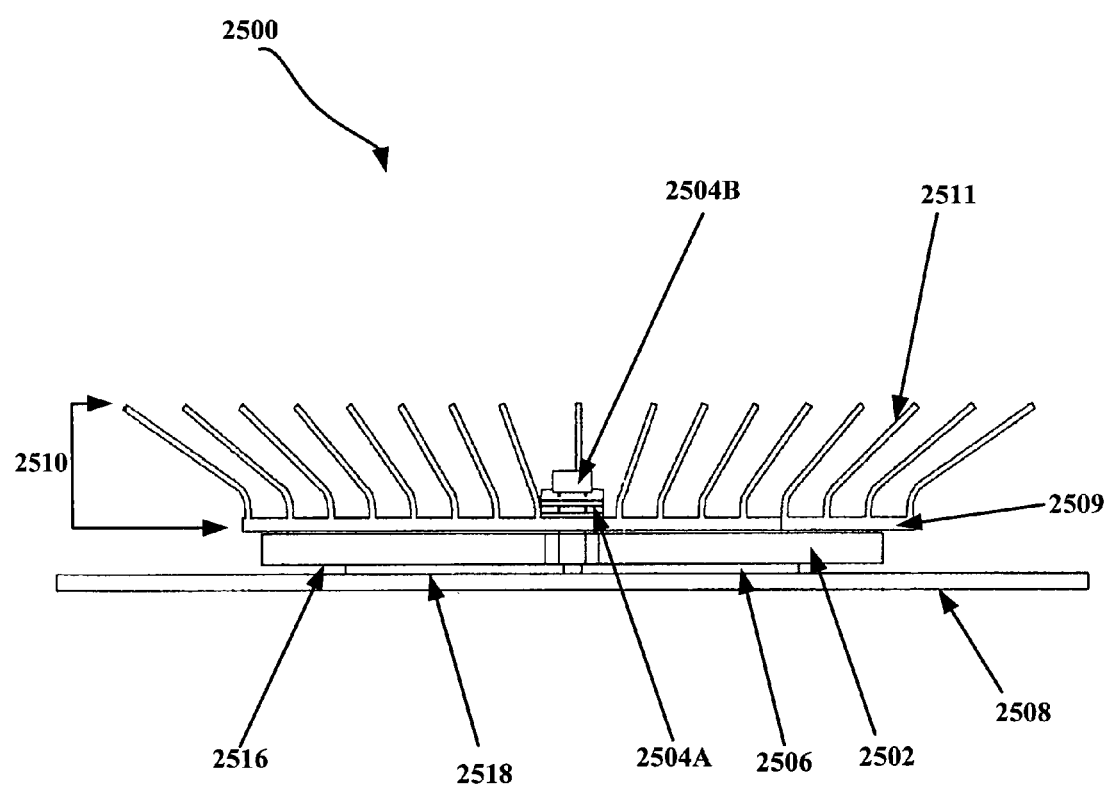
FIG. 26 is a side profile view of the heat sink assembly in accordance with the fourth exemplary embodiment.
Figure 27:
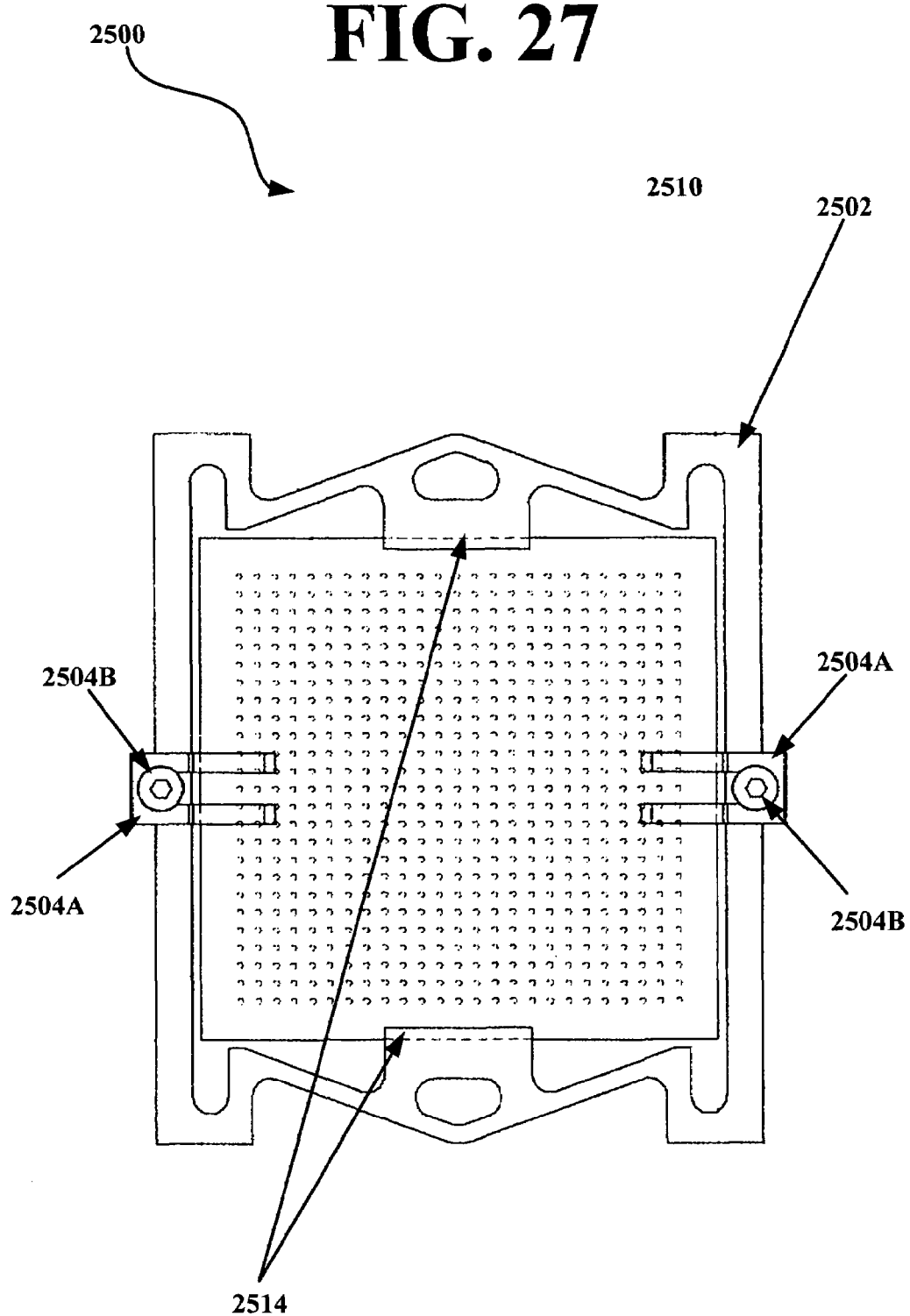
FIG. 27 is a top plane view of the heat sink assembly in accordance with the fourth exemplary embodiment.

FIGS. 25, 26 and 27 are, respectively, an assembled perspective view, a side profile view and top plane view of a heat sink assembly 2500 in accordance with a fourth exemplary embodiment. The heat sink assembly 2500 has a frame clip 2502 and a spring clip 2504. The spring clip 2504 may be a side-coupled spring clip. A heat producing device 2506 can be coupled to a board 2508 or other support structure. Similar to the first exemplary embodiment, the heat producing device 2506 of the fourth exemplary embodiment can be a variety of devices. A heat sink 2510 is used to dissipate heat from the heat producing device 2506. The heat sink 2510 has a base portion 2509 and a top fin 2511 portion. Individual fins 2511 may vary in length and individual fins 2511 may be at varying angles with respect to the base 2509. The heat sink 2510 can be positioned against the heat producing device 2506. Heat is transferred from the heat producing device 2506 to the heat sink 2510 by thermal conduction. A thermally conductive layer (not shown) can be placed in between the heat sink 2510 and the heat producing device 2506 to aid in the conduction of heat.

Figure 28:
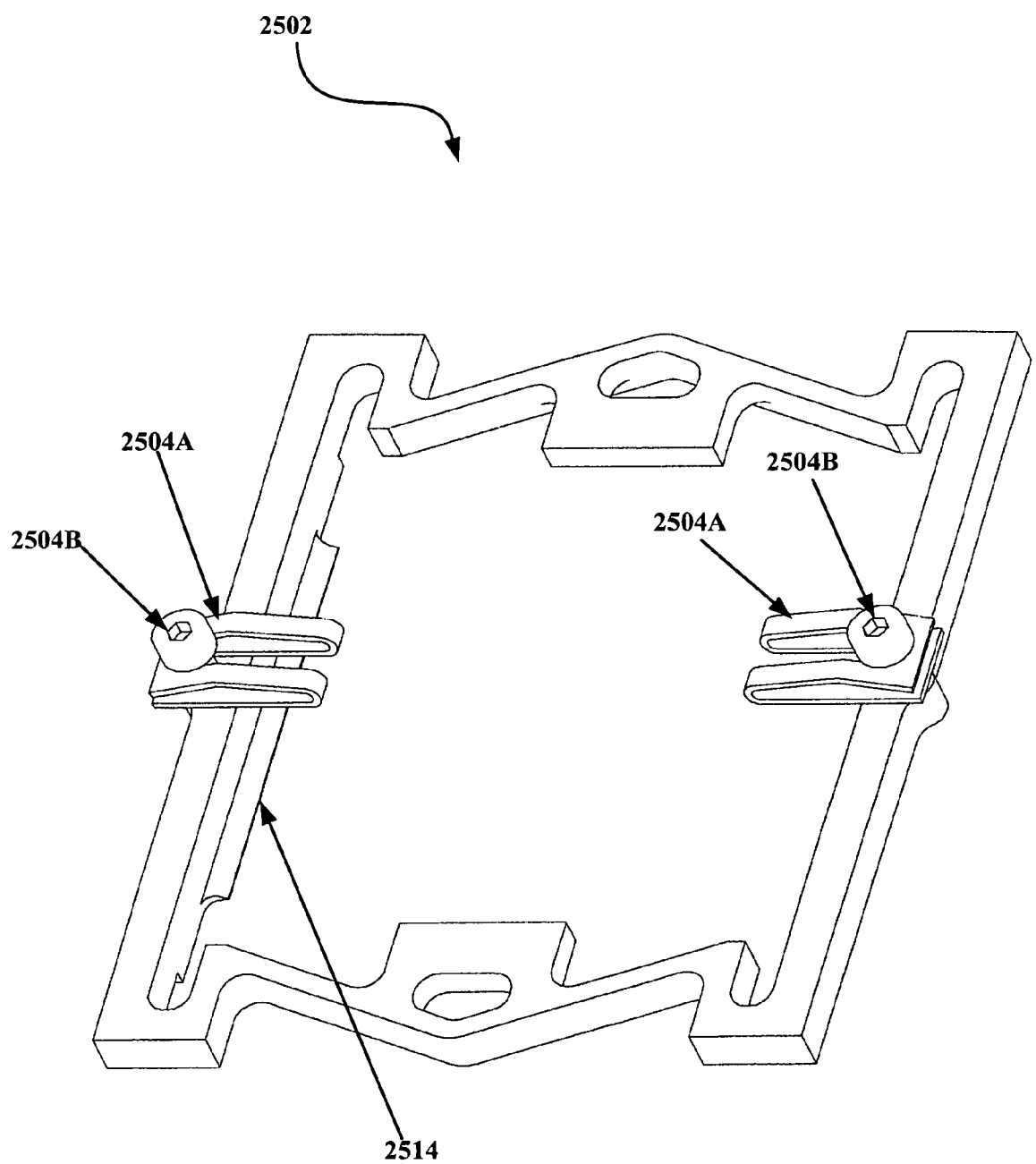
FIG. 28 is a perspective view of the frame clip in accordance with the fourth exemplary embodiment.
Figure 29:
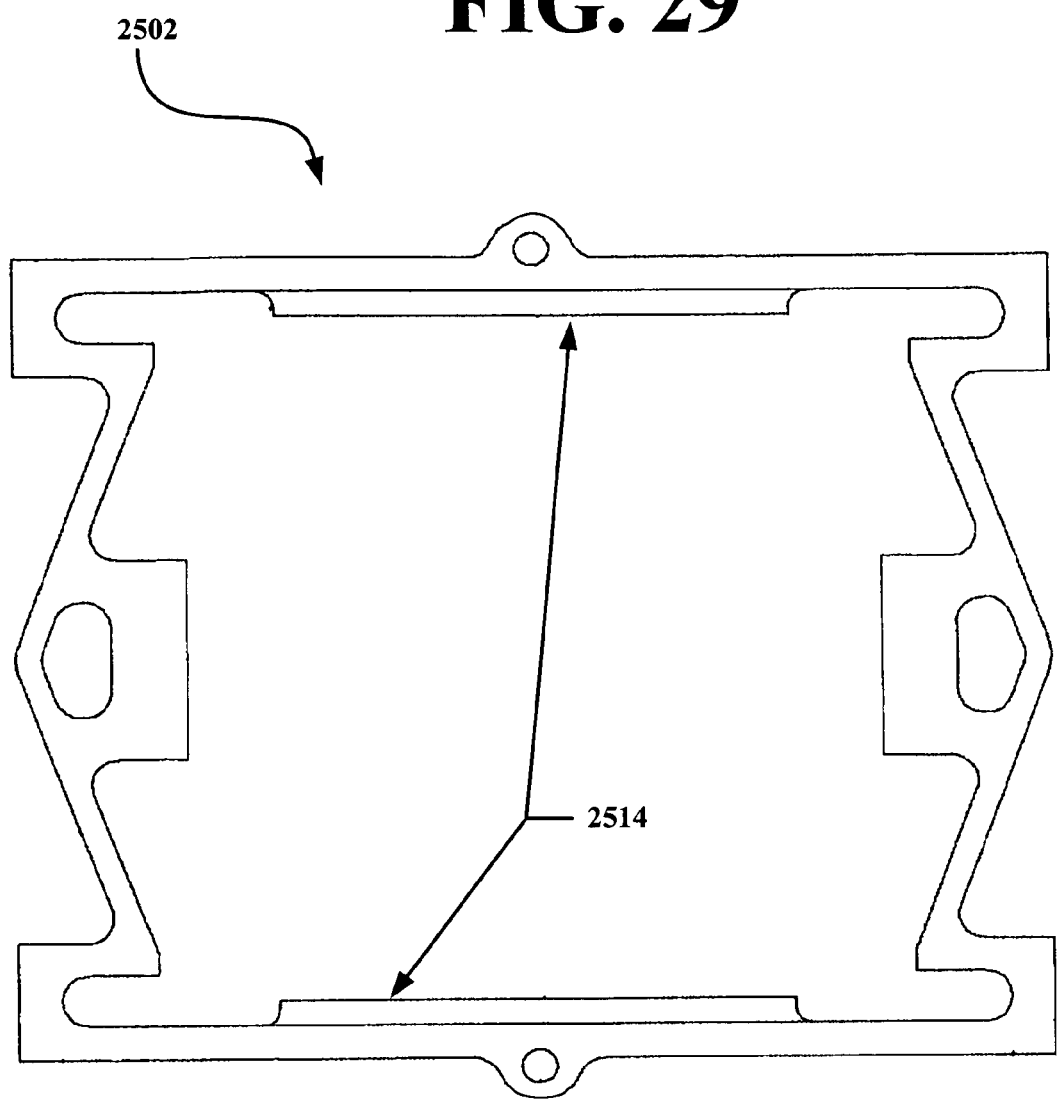
FIG. 29 is a top plane view of the frame clip in accordance with the fourth exemplary embodiment.
Figure 30:
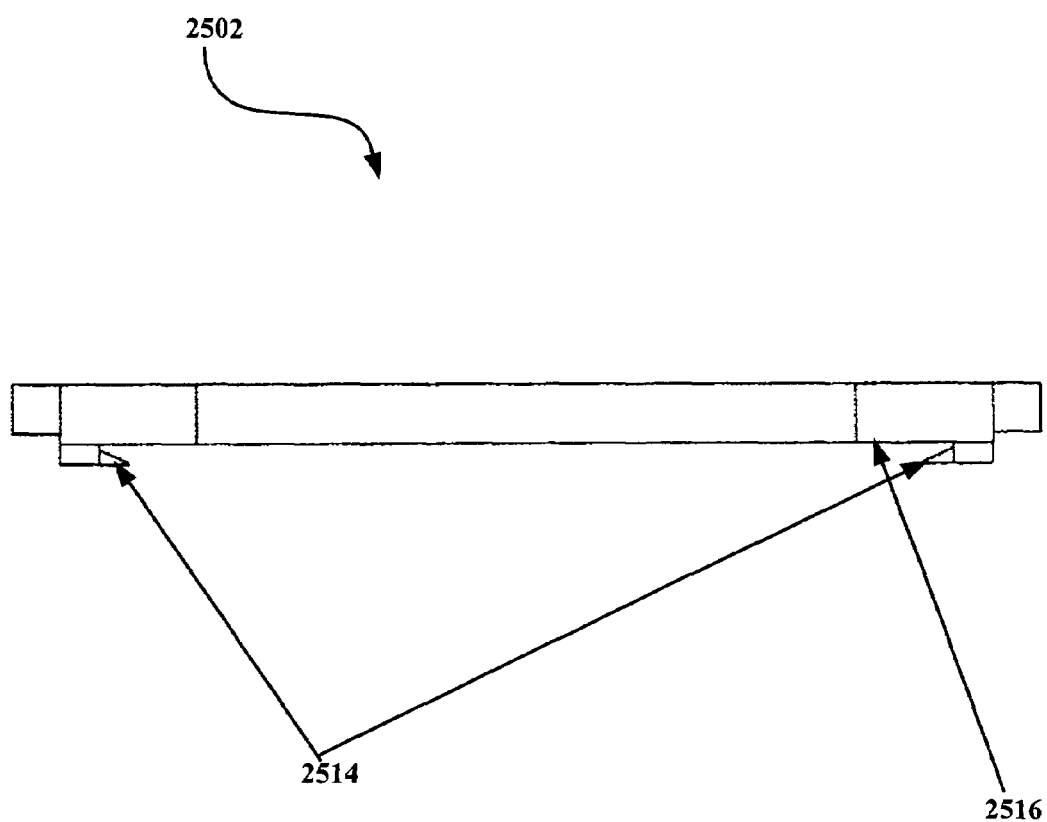
FIG. 30 is a side profile view of the frame clip in accordance with the fourth exemplary embodiment.
Figure 31:
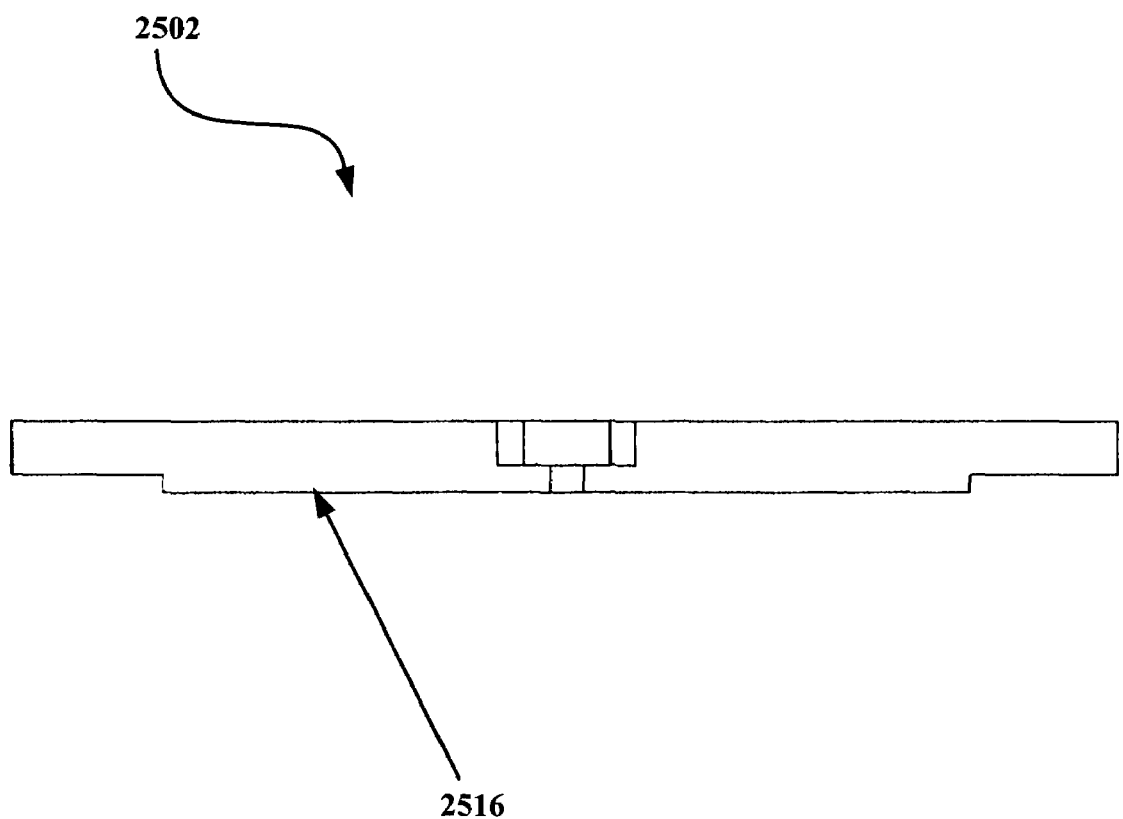
FIG. 31 is a front profile view of the frame clip in accordance with the fourth exemplary embodiment.

The frame clip 2502 of the fourth exemplary embodiment fits over the heat producing device 2506. Tabs 2514 extend from a base 2516 of the frame clip 2502 and couple to a bottom edge 2518 (as shown in FIGS. 28-30) of the heat producing device 2506. A base 2509 (not shown) of the heat sink 2510 fits within the frame clip 2502. The spring clip 2504 removably couples to the frame clip 2502. The base 2516 of the frame clip 2502 can rest against the board 2508. The frame clip 2502 can prevent the transfer of weight or accidental forces placed on the heat sink 2510.

Once the heat sink 2510 is positioned within the frame clip 2502, the spring clip 2504 is coupled to the top of the frame clip 2502. According to the fourth exemplary embodiment, the spring clip 2504 can include one or more side-coupled spring clips 2504. Once the spring clip 2504 is coupled to the frame clip 2502, the spring clip 2504 exerts a force on the heat sink 2510. The force is exerted toward the heat producing device 2506, pressing the heat sink 2510 against the heat producing device 2506. The force assists the heat sink 2510 in maintaining contact with the heat producing device 2506 and facilitates the conduction of heat from the heat producing device 2506.

The spring clip 2504 of the fourth exemplary embodiment can be made of a variety of elastic materials, for example, but not limited to, plastics, metals, or composites. The spring clip 2504 has a spring bias sized to produce a vertical force pressing the heat sink 2510 against the heat producing device 2506. Each side-coupled spring clip 2504 is a portion of doubled-over material 2504A with a slot in the center of the material 2504A. A fastener 2504B extends through the slot and couples the spring clip 2504 to the frame clip 2502. The fasteners 2504B can be a variety of mechanical fasteners, for example, but not limited to, screws, pins or brackets. In the fourth exemplary embodiment, the fastener 2504B is a screw. The screw type fastener 2504B allows the tension of the spring clip 2504 to be adjusted by tightening or loosening the screw, thereby altering the force exerted on the heat sink 2510 and heat producing device 2506.

FIGS. 28, 29, 30, and 31, respectively, are a perspective view, top plane view, side profile view, and front profile view of the frame clip 2502 in accordance with the fourth exemplary embodiment. The frame clip 2502 fits over the heat producing device 2506. Two or more tabs 2514 extend from the base 2516 of the frame clip 2502 and couple to the bottom edge 2518 of the heat producing device 2506. The tabs 2514 can be positioned opposite each other to allow the frame clip 2502 to securely couple to the heat producing device 2506. The distance between the opposing tabs 2514 can be spaced a distance apart to allow the base 2516 of the frame clip 2502 to fit over top of the heat producing device 2506 in an extended or stretched position, while producing a frictional fit to the bottom edge 2518 of the heat producing device 2506 in a relaxed condition. The invention is not limited to the tab structures 2514 or the frame clip 2502 shape as shown in FIGS. 28-30. A variety of other tab structures can be used, e.g., the tab 2514 is shown to rise abruptly from the base 2516 but the tab 2514 may also rise in a tapering manner, depending on a given application, from the base 2516.

Any process descriptions or blocks in flow charts should be understood as representing modules, segments or portions of code which include one or more executable instructions for implementing specific logical functions or steps in the process, and alternate implementations are included within the scope of the preferred embodiment of the present invention in which functions may be executed out of order from that shown or discussed, including substantially concurrently or in reverse order, depending on the functionality involved, as would be understood by one of ordinary skill in the art of the invention.

Figure 32:
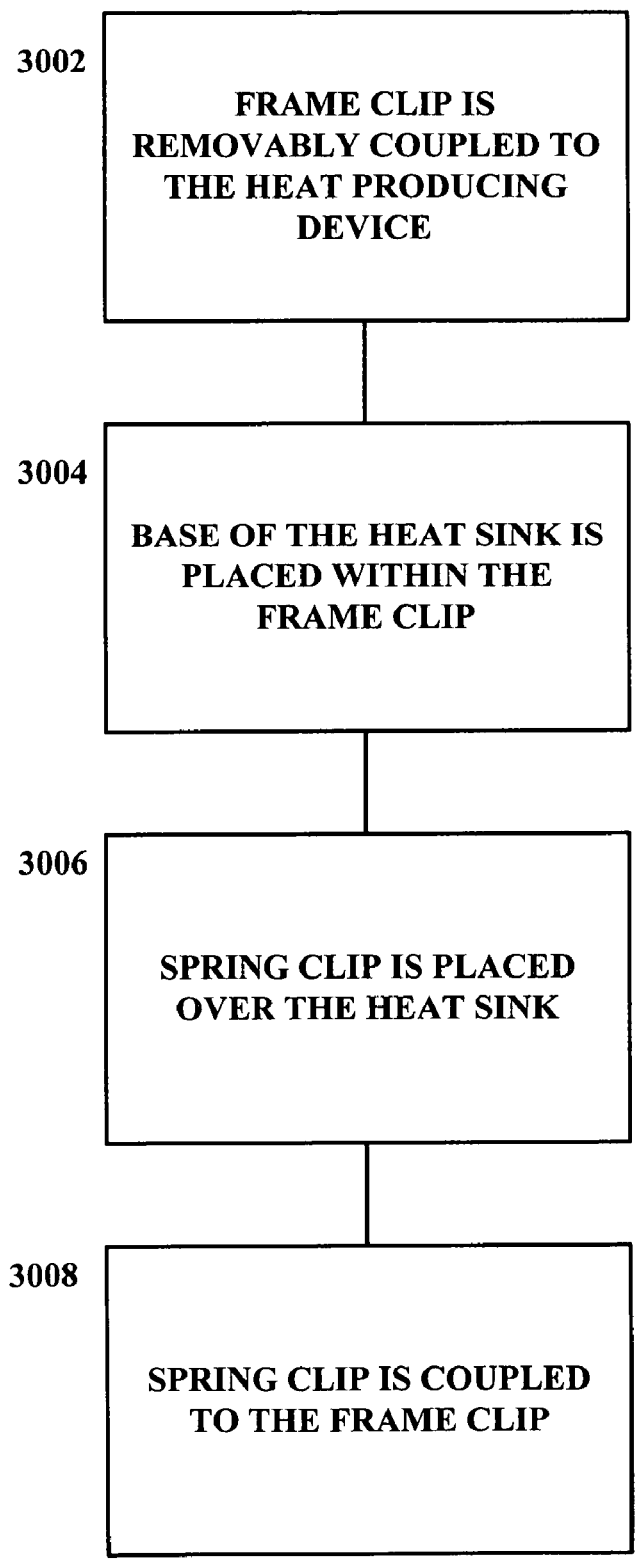
FIG. 32 is a flow-chart illustrating a method for making the apparatus of the present invention in accordance with the first exemplary embodiment.

The first exemplary embodiment of the invention can be implemented using the following method 3000 as shown in the flow-chart of FIG. 32. The frame clip 202 is removably coupled to the heat producing device 206 (Block 3002). A base 209 of the heat sink 210 is placed within the frame clip 202 (Block 3004). A spring clip 204 is placed over the heat sink 210 (Block 3006) and coupled to the frame clip 202 (Block 3008). The coupled spring clip 204 exerts a force on the heat sink 210 that maintains contact between the heat sink 210 and the heat producing device 206. The heat sink assembly 200 allows an individual to change the heat sink 210 by removing the spring clip 204 and the previously installed heat sink 210. The individual places a new heat sink 210 within the frame clip 202 and couples the spring clip 204 back onto the frame clip 202. The frame clip 202 is not removed from the heat producing device 206, limiting stress on the heat producing device 206 during an event of changing the heat sink 210.

Figure 33:
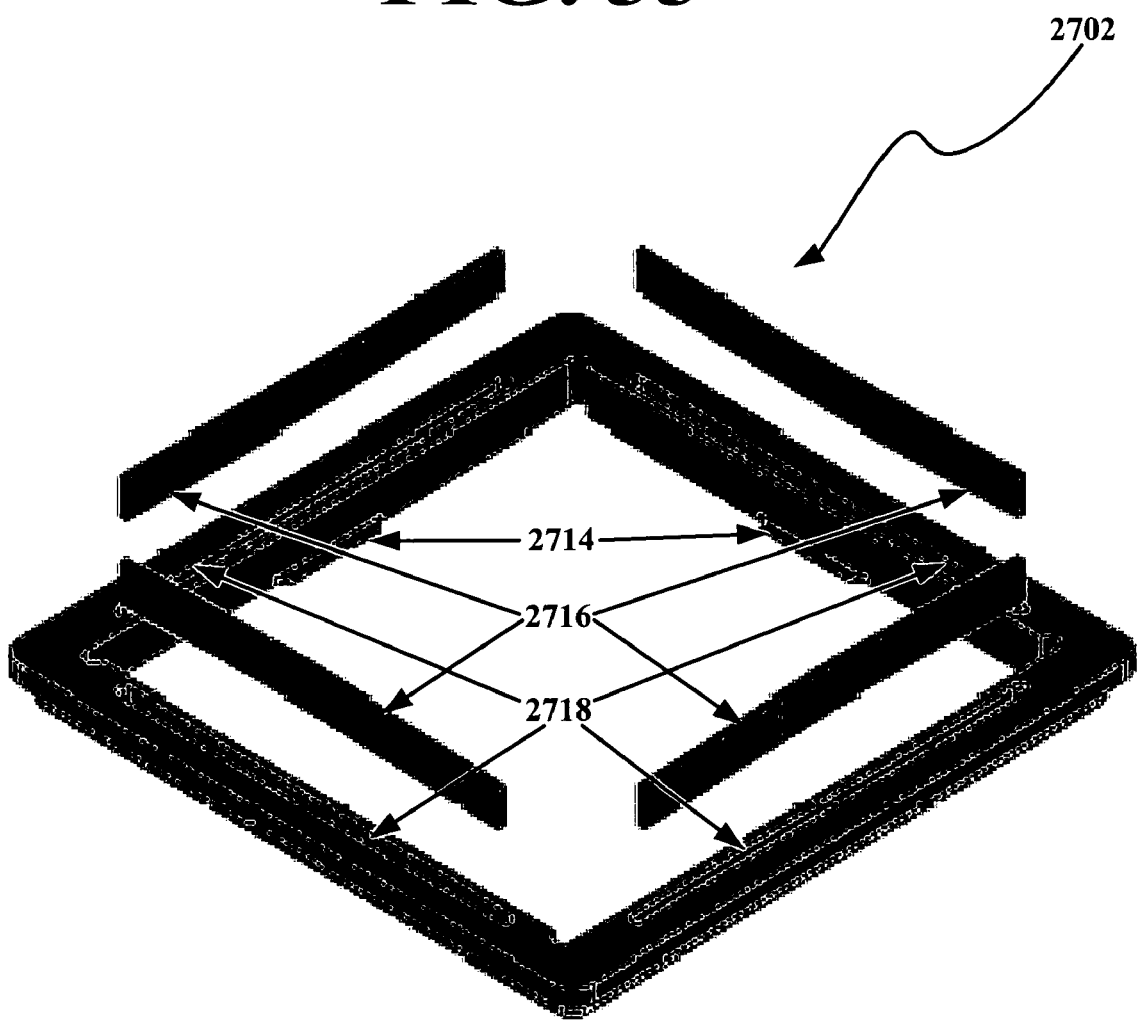
FIG. 33 is an exploded perspective view of a frame clip in accordance with a fifth exemplary embodiment.

FIG. 33 is an exploded perspective view of the frame clip 2702 in accordance with a fifth exemplary embodiment of the invention. The frame clip 2702 fits over a heat producing device 2506, as illustrated in FIG. 26. The frame clip 2702 has a tab 2714 on each of the four sides of the frame clip 2702 as shown in FIG. 33. Two of the tabs 2714 are not visible in FIG. 33. It should be noted that the location of each tab 2714 on a side of the frame clip 2702 may vary along the side of the frame clip 2702, from an essentially middle location shown in the FIG. 33. The frame clip 2702 also features a slot 2718, in each of the sides of the frame clip 2702, to accommodate a spring stiffener 2716. As an example, if a frame clip 2702 has four sides, the frame clip 2702 may have four slots 2718 and four spring stiffeners 2716. The function of the spring stiffener 2716 is to maintain pressure of the frame clip 2702 on a heat producing device 2506 (FIG. 26) by resisting effects of temperature cycling encountered in an application.

Figure 34:
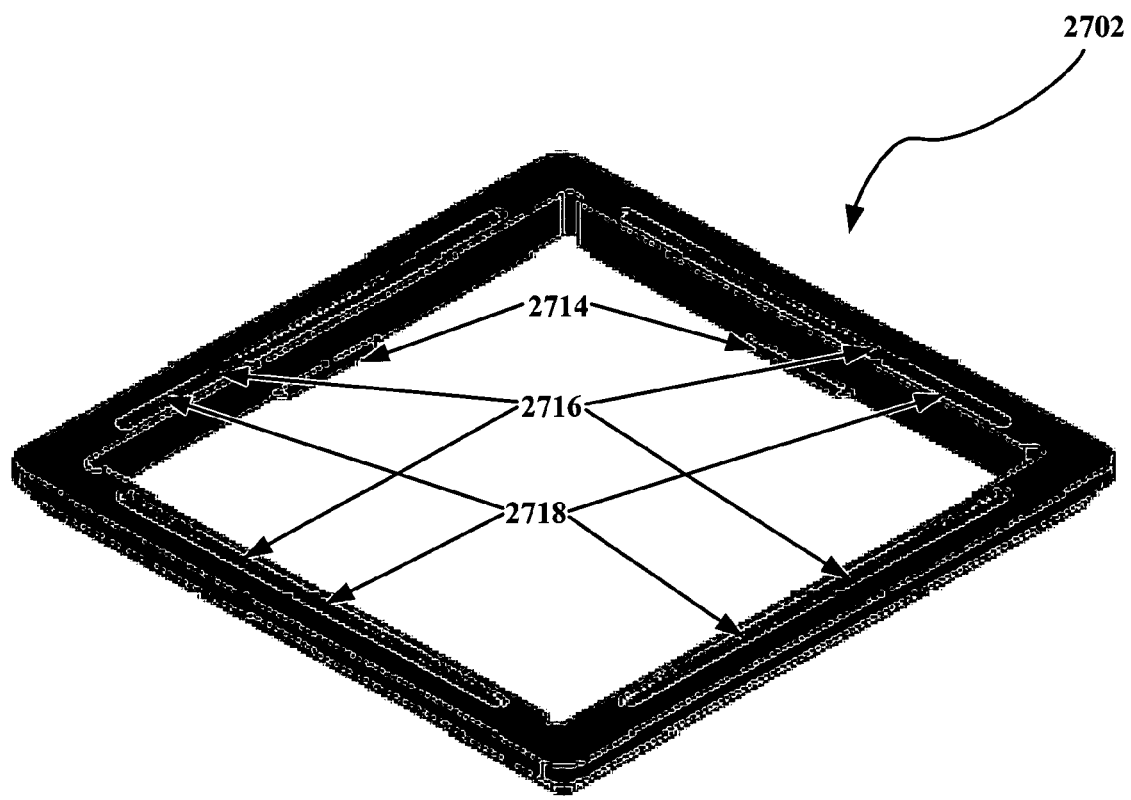
FIG. 34 is an assembled perspective view of the frame clip in accordance with a fifth exemplary embodiment.

FIG. 34 is an assembled perspective view of the frame clip 2702 of FIG. 33, in accordance with the fifth exemplary embodiment of the invention. FIG. 34 illustrates the four tabs 2714, of which two are visible, and the spring stiffeners 2716 inserted into the slots 2718. In a usual application, the frame clip 2702 will first be attached to a heat producing device 2506 (FIG. 26) followed by insertion of the spring stiffeners 2716.

It should be emphasized that the above-described embodiments of the present invention are merely possible examples of implementations, merely set forth for a clear understanding of the principles of the invention. Many variations and modifications may be made to the above-described embodiments of the invention without departing substantially from the spirit and principles of the invention. Different aspects of the various exemplary embodiments may be incorporated together or in combination with other exemplary embodiment. All such modifications and variations are intended to be included herein within the scope of this disclosure and the present invention and protected by the following claims.

What is claimed is:

1. A heat sink assembly mount, comprising:
a frame clip having a top area and a bottom area, at least one inwardly extending tab on each of four sides of the bottom area;
a plurality of vertically extending side portions adjacent to the top area;
the bottom area of the frame clip sized to stretch and fit over and underneath a heat producing device in a stretched condition;
the top of the clip sized to couple to said heat producing device in a relaxed condition with a distance between oppositely disposed vertically extending side portions sized to hold a base of a heat sink, thereby preventing horizontal motion of the heat sink, wherein the heat sink is removable from the frame clip absent removal of said frame clip from said heat producing device; and
a spring clip to fit between heat sink fins and coupled to the frame clip, wherein the spring clip has a spring bias sized to produce a vertical force pressing the heat sink against the heat producing device.

2. The heat sink assembly mount of claim 1, wherein the at least one inwardly extending tab is more than one tab.

3. The heat sink assembly mount of claim 2, wherein the spring clip is "Z-shaped" and removably couples to a top outwardly extending ridge on each of the vertically extending side portions.

4. The heat sink assembly mount of claim 2, wherein the spring clip is "M-shaped" having a first end of the spring clip removably coupled to a first handle extending from the frame clip and a second end of the spring clip removably coupled to a second handle extending from the frame clip.

5. The heat sink assembly mount of claim 2, wherein the spring clip is "M-shaped" having a first end removably coupled to a first handle extending from the frame clip and a second end rotatably coupled to a second handle extending from the frame clip.

6. The heat sink assembly mount of claim 2, wherein the spring clip is at least one side-coupled spring clip with removable fasteners coupling each side clip to the vertically extending side portions of the frame clip.

7. The heat sink assembly mount of claim 2, wherein the tabs are sized to produce a frictional fit coupling to the heat producing device.

8. The heat sink assembly mount of claim 2, wherein the tabs are sized to fit within an indentation on the heat producing device.

9. The heat sink assembly mount of claim 2, wherein the tabs are positioned so as to prevent horizontal movement between the heat producing device and the frame clip.

10. The heat sink assembly mount of claim 2, wherein the frame clip has at least one slot therein, said slot being capable of accommodating a spring stiffener, thereby maintaining stability of the frame clip.

11. The heat sink mount assembly of claim 7, wherein the frictional fit between the frame clip and the heat producing device occurs through use of an element selected from the group consisting of: frame clip ridges, protrusions, and a frictional fit against wall of a based of the frame clip.

12. A heat sink assembly comprising:
a heat sink having a base portion in communication with fins extending from a top side thereof;
a frame clip comprising:

a top wall portion with a perimeter sized to receive the base portion of the heat sink and to prevent horizontal motion of the heat sink; and a bottom wall portion with a perimeter sized to receive a heat producing device, the bottom wall portion having an inwardly extending ridge on all four sides of the bottom portion, said bottom wall portion sized to fit over said heat producing device in a stretched condition and removably couple in a relaxed condition to said heat producing device, wherein the heat sink is removable from the frame clip absent removal of said frame clip from said heat producing device; and a spring clip to fit between heat sink fins and removably coupled to the frame clip and against the heat sink wherein the spring clip has a spring bias sized to produce a vertical force pressing the heat sink against the heat producing device.

13. The heat sink assembly of claim 12, wherein the spring is "Z-shaped" and removably couples to a top outwardly extending ridge on the top wall portion.

14. The heat sink assembly of claim 12, wherein the spring is "M-shaped" having a first end of the spring clip removably coupled to a first handle extending from the frame clip and a second end of the spring clip removably coupled to a second handle extending from the frame clip.

15. The heat sink assembly of claim 12, wherein the spring is "M-shaped" having a first end of the spring clip removably coupled to a first handle extending from the frame clip and a second end of the spring clip rotatably coupled to a second handle extending from the frame clip.

16. The heat sink assembly of claim 12, wherein the spring clip, having a plurality of side portions, is a two-piece, side clip with removable fasteners coupling each side clip to the plurality of side portions of the frame clip.

17. The heat sink assembly of claim 12, wherein a perimeter of the inwardly extending ridge is sized to produce a frictional fit coupling to the heat producing device.

18. The heat sink assembly of claim 12, wherein a perimeter of the inwardly extending ridge is sized to fit within an indentation on the heat producing device.

19. The heat sink assembly mount of claim 12, wherein the frame clip has a plurality of slots, said slot capable of accommodating a spring stiffener.

20. The heat sink assembly of claim 12, wherein a perimeter of the inwardly extending ridge is sized to fit underneath the heat producing device.

21. A method of installing a heat sink on a heat producing device, comprising the steps of:

placing a frame clip over a perimeter of the heat producing device in a stretched condition and placing the frame clip over and underneath the heat producing device in a relaxed condition, the frame clip having at least one inwardly extending tab;

fitting the heat sink within the frame clip after the frame clip is stretched over the heat producing device;

placing a base of a heat sink into the frame clip;

placing a spring clip over the heat sink between heat sink fins; and coupling the spring clip to the frame clip.

\* \* \* \* \*